United States Patent [19]

Beaubien

[11] 4,408,157

[45] Oct. 4, 1983

[54] RESISTANCE MEASURING ARRANGEMENT

[75] Inventor: William H. Beaubien, Mundelein, Ill.

[73] Assignee: Associated Research, Inc., Skokie, Ill.

[21] Appl. No.: 260,303

[22] Filed: May 4, 1981

[51] Int. Cl.³ .............................................. G01R 27/02
[52] U.S. Cl. .................................................... 324/62
[58] Field of Search ...................... 324/62, 57 R, 65 R

[56] References Cited

U.S. PATENT DOCUMENTS 3,060,379 10/1962 Osvold ............................. 324/62 R
3,633,098 1/1972 Westlund .......................... 324/62 R

FOREIGN PATENT DOCUMENTS 2915491 10/1980 Fed. Rep. of Germany ........ 324/62
54-130965 10/1979 Japan ..................................... 324/62
55-39069 3/1980 Japan ..................................... 324/62
2036982 7/1980 United Kingdom ................. 324/62

OTHER PUBLICATIONS

Bailey: "Ohmmeter Reads to 300 Megohms".—Radio-Electronics, Apr. 1949—p. 55.
Scroggie: "A Valve Megohmmeter"—Wireless World—Nov. 1953, p. 516.
Kränkel et al.: "A Method for Checking the Turn Insulation . . . " Brown-Boveri Review—4/1970—vol. 57.

Oliver et al. "Electronic Measurements and Instrumentation" McGraw Hill—1972.

Primary Examiner—Stanley T. Krawczewicz
Assistant Examiner—Jose M. Solis
Attorney, Agent, or Firm—Mason, Kolehmainen, Rathburn & Wyss

[57] ABSTRACT

The invention employs a pair of known resistors which are permanently connected to the input terminals to which the unknown resistor may be connected. A source of d.c. voltage is connected to one input terminal and the voltage drops produced across each known resistor are alternately sampled and supplied to an A/D converter which converts these voltage drops into corresponding digital signals. A microprocessor computes the quantity $VR1/VR2 - 1$ where VR1 is the voltage drop across one known resistor and VR2 is the voltage drop across the other known resistor. The computed quantity is a linear function of the value of the unknown resistance. This computed quantity may then be converted to a corresponding analog signal and supplied to a meter. Since no switches are connected across the unknown resistor, leakage problems normally associated with extremely high resistance measurements are virtually eliminated and very high resistances in the order of 5000–10,000 megohms may be accurately measured and displayed.

39 Claims, 10 Drawing Figures

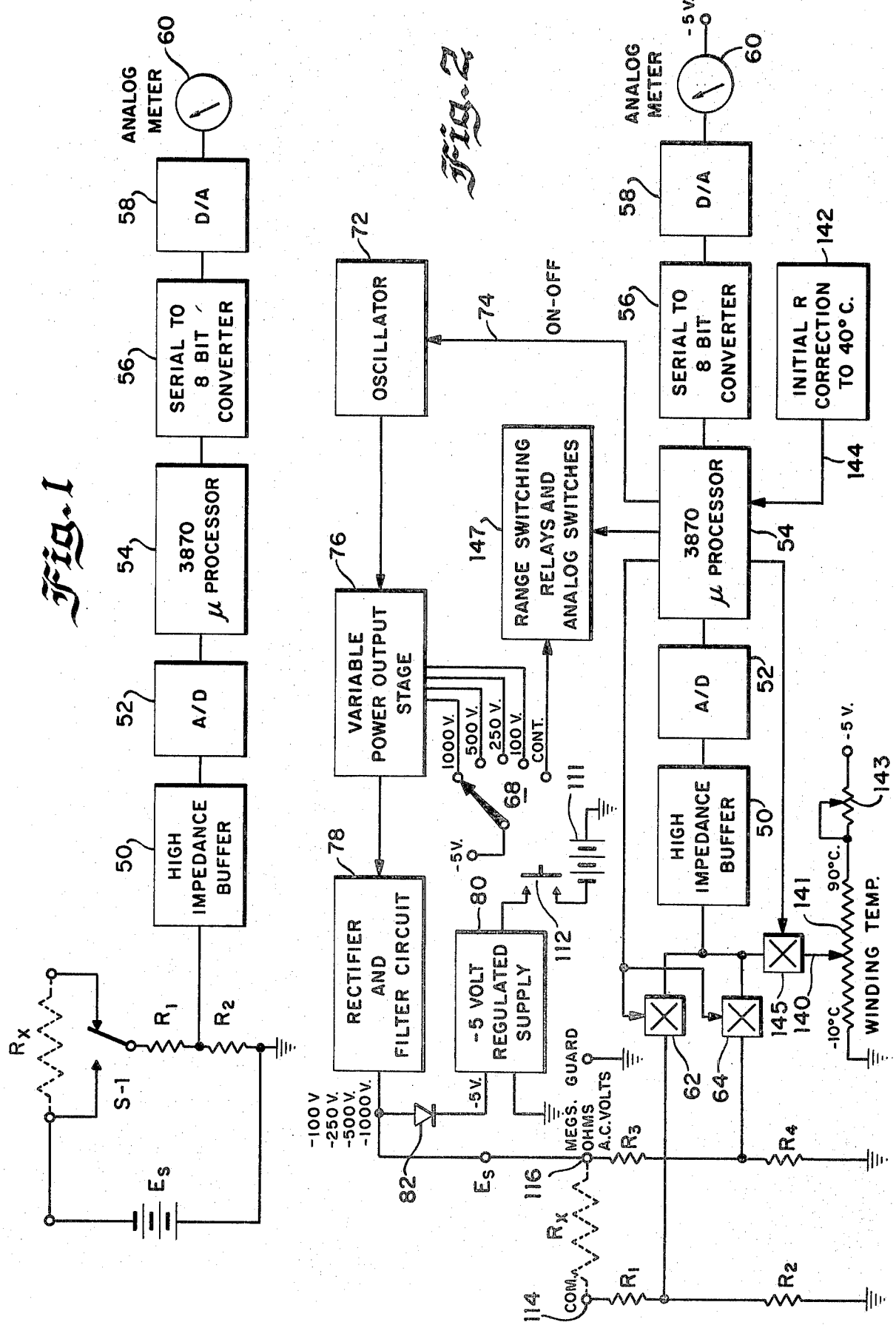

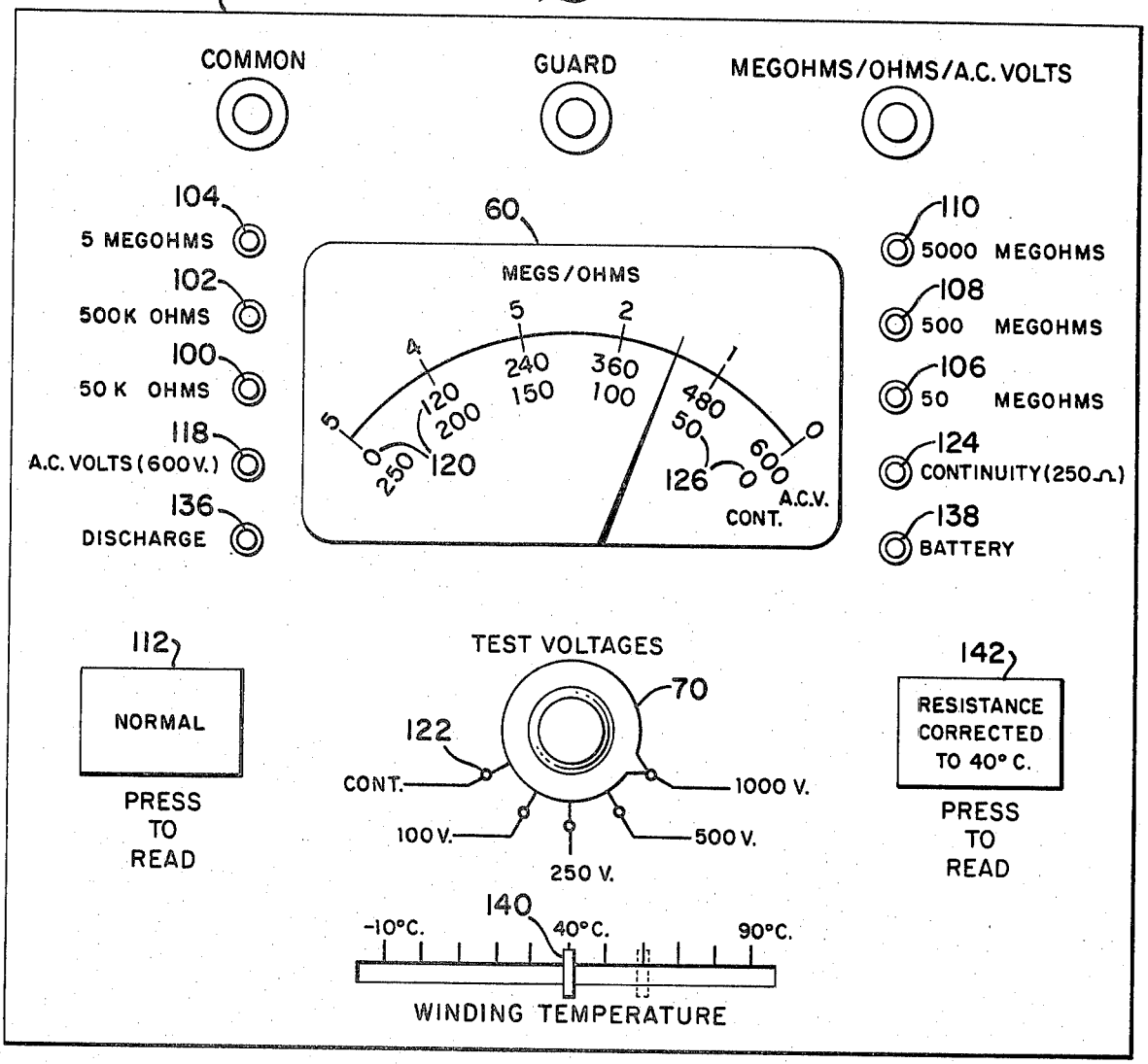
Fig. 3
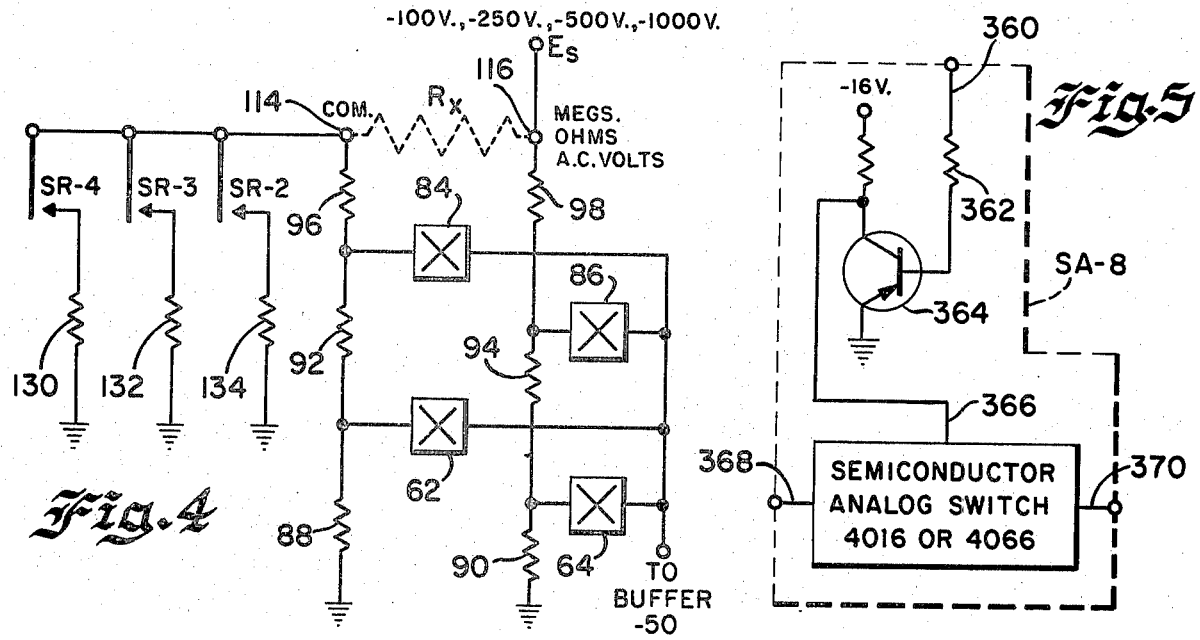
Fig. 4
Fig. 5

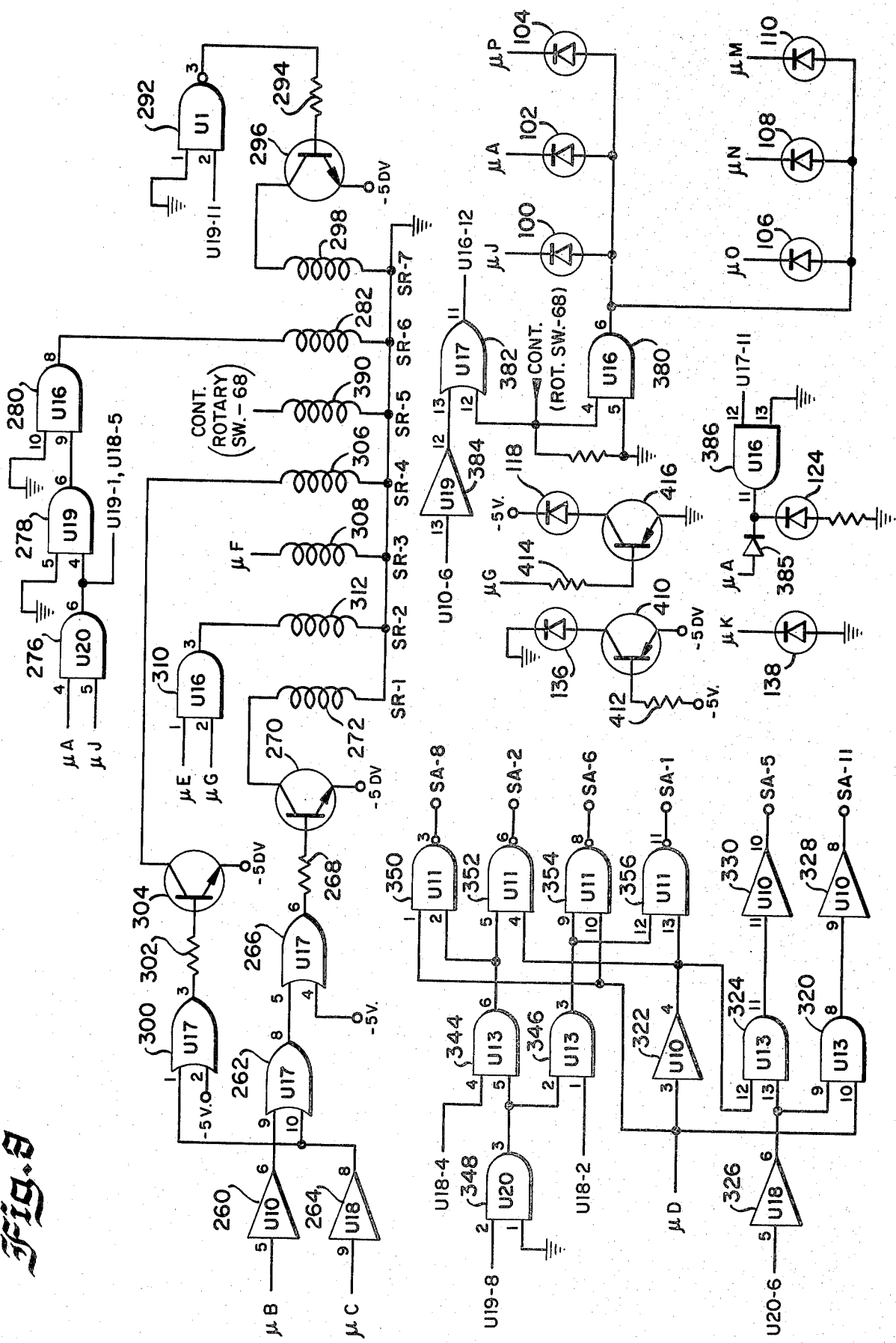

Fig.9

12 BIT COUPLING TO MICROPROCESSOR-54 (179)

| A/D CONV.-52 PIN NUMBER | BUFFER PIN NO. | BUFFER PIN NO. | μP-54 PIN NUMBER |
|---|---|---|---|
| 1 LSB | U8-3 | → U8-5 | 3 |
| 2 | U8-4 | → U8-3 | 4 |
| 3 | U8-5 | → U8-1 | 5 |
| 4 | U8-8 | → U8-9 | 6 |
| 5 | U8-10 | → U8-11 | 8 |
| 6 | U8 12 | → U8 13 | 9 |
| 7 | U7-2 | → U7-1 | 10 |
| 8 | U7-4 | → U7-3 | 11 |
| 9 | U7-6 | → U7-5 | 12 |
| 10 | U7-12 | → U7-13 | 13 |
| 11 | U7-10 | → U7-11 | 14 |
| 12 MSB | U7-8 | → U7-9 | 15 |

SERIAL-8 BIT CONV.-56 TO D/A CONV.-58 (181)

| CONV.-56 PIN NUMBER | CONV.-58 PIN NUMBER |
|---|---|
| 3 | 11 LSB |
| 4 | 10 |
| 5 | 9 |
| 6 | 8 |
| 10 | 7 |
| 11 | 6 |
| 12 | 5 |
| 13 | 4 MSB |

MICROPROCESSOR-54 FUNCTIONS (183)

| SCHEMATIC IDENTIFICATION | PIN NUMBER | FUNCTION |
|---|---|---|
|  | 3-6, 8-15 | 12 BIT INPUT FROM U7 AND U8 |
| μD | 16 | SAMPLING LOW-KNOWN HIGH-UNKNOWN |
| μC | 17 | 5 MEGOHM SCALE |
| μB | 18 | MEASURE RESISTANCE |
| μA | 19 | 500 K OHM SCALE |
| μK | 22 | BATTERY LIGHT |
|  | 23 | DATA TO SERIAL / PARALLEL CONVERTER |
|  | 24 | CLEAR |
|  | 25 | CLOCK |
| μE | 26 | 500 MEGOHM SCALE |
| μF | 27 | 50 MEGOHM SCALE |
| μG | 28 | MEASURE A.C. |
| μH | 29 | MEASURE TEMPERATURE CORRECTION |
|  | 30 | INITIATE A/D CONVERSION |
| μJ | 31 | 50 K OHM SCALE |
| μI | 32 | MEASURE BATTERY |
| μL | 33 | INITIATE TEMPERATURE CONVERSION |
| μM | 34 | 5000 MEGOHM LIGHT |
| μN | 35 | 500 MEGOHM LIGHT |
| μO | 36 | 50 MEGOHM LIGHT |
| μP | 37 | 5 MEGOHM LIGHT |

RESISTANCE MEASURING ARRANGEMENT

The present invention relates to resistance measuring arrangements, and more particularly, to resistance measuring arrangements which are adapted to measure insulation resistances in the order of hundreds or thousands of megohms.

Various types of resistance measuring arrangements have been heretofore proposed. In Lucas U.S. Pat. No. 3,836,847 a resistance measuring arrangement is disclosed wherein the voltage across an unknown resistor and the voltage across a calibrated resistor of known resistance value are employed to determine the resistance of the unknown resistor. Dornberger et al. U.S. Pat. No. 3,213,361 uses a frequency measurement to calculate the unknown resistance. Thuot U.S. Pat. No. 4,104,578 discloses a resistance tester which employs a digital ratiometer. Gartner U.S. Pat. No. 4,006,319 discloses an arrangement for determining the magnitudes of the equivalent voltage source impedance and the equivalent voltage source voltage on a telephone line. Hall U.S. Pat. No. 4,196,474 discloses an arrangement wherein a microprocessor is employed to calculate ratios which indicate impedance. An article by Taylor entitled "Measurement of High Resistance Using an Operational Amplifier," which appeared in Electronic & Radio Technician (GB) Vol. 4, No. 3, pages 129–132 (October 1970) also discloses a high resistance meter arrangement which employs an operational amplifier to provide a relatively high current signal for driving a milliameter rather than the conventional microammeter. None of these prior art measuring arrangements is suitable to measure high resistances in the order of thousands of megohms while providing a linear meter scale.

Various arrangements have also been heretofore proposed for switching between different ranges of an ohmmeter or voltmeter arrangement. These are shown, for example, in Flood et al. U.S. Pat. No. 3,187,323, Nordholm U.S. Pat. No. 3,536,998 and Cook et al. U.S. Pat. No. 4,114,094. None of these arrangements are suitable for use in a high resistance measuring circuit wherein the problem of leakage at the unknown resistance terminals is particularly important.

Cliffgard et al. U.S. Pat. No. 3,528,904 and Westlund U.S. Pat. No. 3,633,098 are directed to temperature compensating arrangements for use in various types of measuring instruments. However, these arrangements are not capable of providing temperature corrected resistance readings which are calculated in accordance with the setting of a manually adjustable potentiometer so that resistance readings corrected to a standardized temperature, such as 40° C., can be displayed.

Lozowski U.S. Pat. No. 4,092,591 discloses an ohmmeter protection circuit wherein voltage on the ohmmeter probes actuates an electronic switch sufficiently rapidly to disconnect the ohmmeter from the measuring probes "before the external voltage can damage the ohmmeter." Such an arrangement has the disadvantage that external voltages having an extremely steep wavefront may still damage the ohmmeter.

Briefly considered, the preferred arrangement of the present invention employs a pair of known resistors which are permanently connected to the input terminals to which the unknown resistor may be connected. A source of d.c. voltage is connected to one input terminal and the voltage drops produced across each known resistor are alternately sampled and supplied to an A/D converter which converts these voltage drops into corresponding digital signals. A microprocessor computes the quantity VR1/VR2−1 where VR1 is the voltage drop across one known resistor and VR2 is the voltage drop across the other known resistor. The computed quantity is a linear function of the value of the unknown resistance. This computed quantity may then be converted to a corresponding analog signal and supplied to a meter. Since no switches are connected across the unknown resistor, leakage problems normally associated with extremely high resistance measurements are virtually eliminated and resistances as high as 5000–10,000 megohms may be accurately measured and displayed.

It is, therefore, an object of the present invention to provide a new and improved arrangement for measuring high resistances, in the order of thousands of megohms, in which a reading is provided which is a linear function of the value of the unknown resistance.

It is another object of the present invention to provide a new and improved high resistance measuring arrangement wherein a resistance reading corrected to a standardized temperature, such as 40° C., is provided.

It is a further object of the present invention to provide a new and improved automatic range switching arrangement which is particularly suitable for use in a high resistance measuring instrument.

It is another object of the present invention to provide a new and improved resistance measuring arrangement in which damage to the resistance measuring circuitry by external voltages on the measurement probes is positively prevented.

It is a further object of the present invention to provide a new and improved circuit arrangement for discharging any capacity associated with the unknown resistance after the resistance measurement has been made and the test voltage has been removed from the unknown resistance.

The invention, both as to its organization and method of operation, together with further objects and advantages thereof, will best be understood by reference to the following specification taken in connection with the accompanying drawings, in which:

FIG. 1 is a schematic diagram partly in block diagram form of one embodiment of the resistance measuring arrangement of the present invention;

FIG. 2 is a schematic diagram of an alternative embodiment of the present invention;

FIG. 3 is a plan view of the front panel of the portable resistance meter of FIG. 2;

FIG. 4 is a schematic diagram of a further alternative embodiment of the present invention;

FIG. 5 is a circuit diagram of one of the semiconductor analog switches employed in the arrangement of FIGS. 2 and 4; and FIGS. 6, 7, 8 and 9, when placed in the order shown in FIG. 10, comprises a detailed circuit diagram illustrating the preferred embodiment of the present invention.

Figure 6:
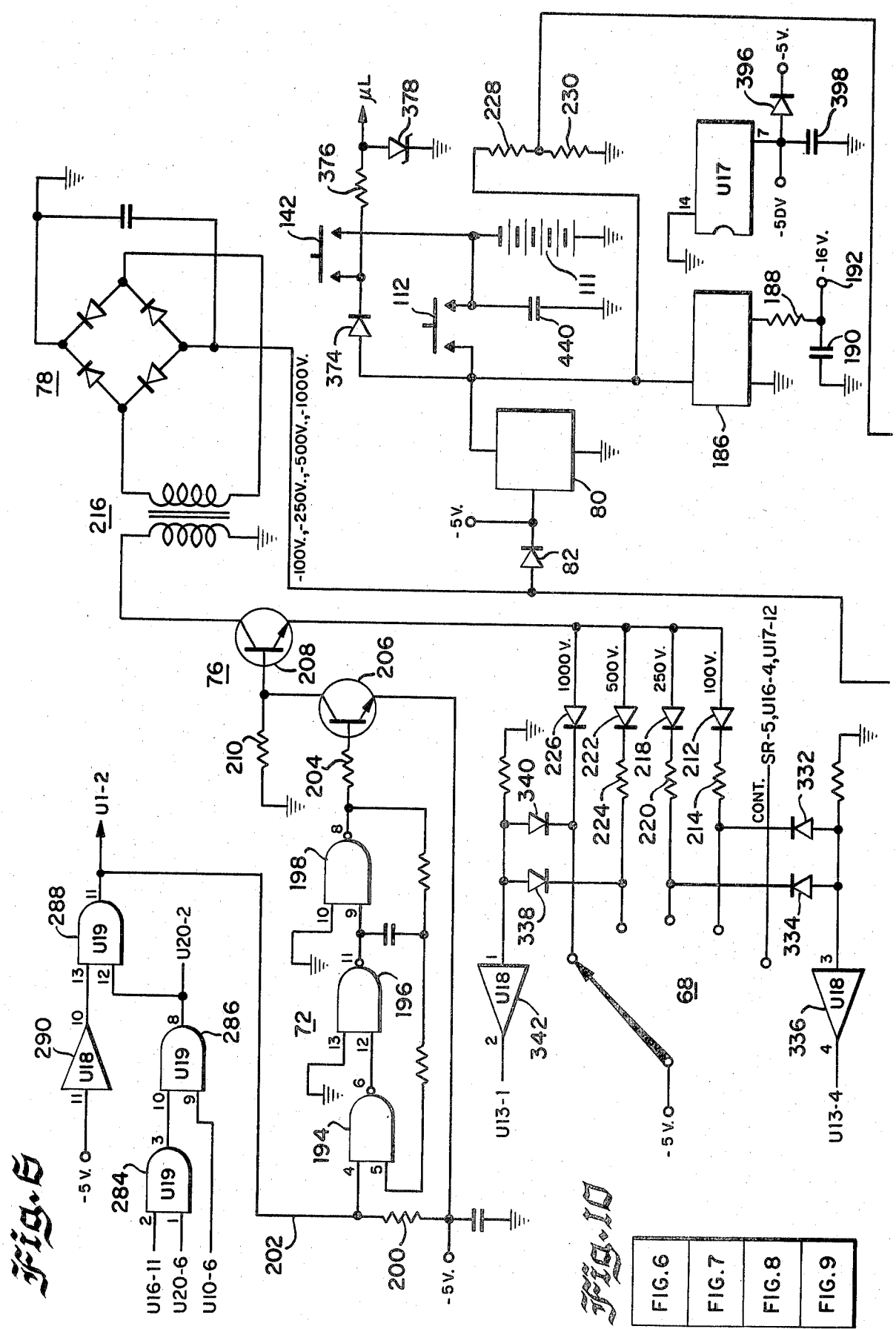

Referring now to the drawings, and more particularly to FIG. 1, wherein the basic principles of the high resistance measuring technique of the present invention are shown, the unknown resistance to be measured is designated as $R_x$. The unknown resistance $R_x$ may comprise the insulation resistance of a transformer or motor winding and, in accordance with an important aspect of the present invention may have a resistance as high as 5000 to 10,000 megohms. A sampling switch indicated at S-1 is employed selectively to connect the unknown resistance $R_x$ in series with the known resistors R1 and R2 across a power supply designated as $E_s$. More particularly, when the switch S-1 is in the position shown in FIG. 1 the unknown resistance $R_x$ is connected in series with the resistors R1 and R2 across the supply $E_s$ and when the switch S-1 is in its other position the resistors R1 and R2 are connected directly across the power supply $E_s$ and the unknown resistance $R_x$ is out of the circuit. The sampling switch S-1 is preferably an electronic switch which is moved back and forth at a rate of from 30 to 40 cycles per second.

When the switch S-1 is in the position shown in FIG. 1 a relatively small voltage is developed across the voltage divider standard resistance R2 and when the switch S-1 is in the other position a larger voltage is developed across resistor R2. These voltages which are alternately produced across the resistor R2 are supplied through a high impedance buffer 50 to an analog-to-digital converter 52 wherein the analog DC voltages developed across the resistor R2 are transformed to corresponding digital numbers. These digital numbers are applied to a microprocessor 54 which performs certain calculations on these voltages and supplies its output to a serial to eight bit converter 56 the output of which is supplied to a digital to analog converter 58 which provides an output signal to the analog meter 60.

The voltage VR2 developed across the resistor R2 when the switch S-1 is in the position opposite that shown in FIG. 1 is equal to $E_sR2/(R1+R2)$. When the switch S-1 is in the position shown in FIG. 1 the voltage V'R2 across the resistor R2 is equal to $E_sR2/(R1+R2+R_x)$. The voltage ratio $VR2/V'R2 = 1 + R_x/(R1+R2)$. The microprocessor 54 is employed to compute the quantity $(VR2/V'R2)-1$ so that the output of the microprocessor 54 is equal to $R_x/(R1+R2)$. Since R1 and R2 are fixed known resistors the output of the microprocessor is linearly proportional to the unknown resistance $R_x$. This digital output is then converted back to analog form and employed to drive the meter 60 so that the reading of the meter 60 is a direct and linear function of the unknown resistance $R_x$. Thus, for example, if the known resistors R1 and R2 have a total resistance of 1 megohm the quantity $(VR2/V'R2)-1$ computed by the microprocessor 54 will equal 1 when the unknown resistance $R_x$ is 1 megohm, 2 when $R_x$ is 2 megohms, and 5000 when $R_x$ is 5000 megohms. Since the supply voltage $E_s$ is employed during both positions of the sampling switch S-1, the supply voltage drops out of the equation and the quantity computed by the microprocessor 54 is dependent for its accuracy only on the accuracy of the known resistors R1 and R2. In this connection it will be noted that the same result may be obtained when R1=0. However, a relatively large value of R1 is usually required to lower the voltage drop across R2 to a value acceptable by the A/D converter 52 when $E_s$ is a large voltage.

Because the unknown resistance $R_x$ is in the numerator of the quantity computed by the microprocessor 54 the resultant output to the analog meter 60 is linear so that this meter can be calibrated linearly to provide much more readable high resistance values than the conventional meter scale in which the high resistance values are crowded very close together, particularly in the higher resistance ranges. Furthermore, the ability of the arrangement of the present invention to measure extremely high resistances, in the order of 5000–10,000 megohms, while at the same time providing a linear scale, is accomplished without requiring an extremely high value of standard resistance. For example, in the 5000 megohm range of the meter of the present invention the resistances R1 and R2 may have a combined value of 10 megohms, which is a quite reasonable value of standard resistance under varying conditions of temperature and humidity. If, on the other hand, one was attempting to measure such high resistances with a constant current source, such an arrangement would require a standard resistance value approximately equal to the unknown resistance being measured in order to provide a linear reading of the meter. Since a reference resistor of a magnitude of 5000 megohms cannot practicably be obtained, the range of such constant current type of measuring systems is limited to much lower maximum insulation resistance values.

While the arrangement of FIG. 1 is capable of measuring relatively high insulation resistance values while employing a relatively low value standard resistor, it will be noted that the fixed contacts of the sampling switch S-1 are connected across the unknown resistance $R_x$ so that any leakage resistance between these terminals, which may vary with temperature, humidity, and so forth, will prevent an accurate determination of the value of resistance of the unknown resistance $R_x$. Also, in the arrangement of FIG. 1, the voltage divider R1, R2 is connected directly across the supply voltage $E_s$ when the unknown resistance is out of the circuit. This means that the value of R2 must be chosen so that the voltage produced across this resistor does not exceed the acceptable input of the analog-to-digital converter 52 and microprocessor 54. Conventionally, this input is limited to 5 volts. Accordingly, if the supply voltage $E_s$ has a value of 1000 volts and the total resistance of the voltage divider R1, R2 has a value of 10 megohms, the resistor R2 must have a value of only 50,000 ohms in order to limit the voltage across this resistor to 5 volts, the resistance R1 then having a value of 9.95 megohms. However, when the sampling switch S-1 is moved to the unknown position shown in FIG. 1 and assuming the unknown resistance $R_x$ has a value of 1000 megohms the voltage across the resistor R2 will be only 0.05 volts which is too low a voltage for the analog-to-digital converter to accurately convert to a digital number since the A/D analog-to-digital converter 52 has a full scale input of 5 volts.

In order to eliminate these difficulties with the circuit arrangement of FIG. 1, the preferred embodiment of FIG. 2 may be employed. Referring to this figure, two separate voltage divider networks are employed, one of these networks being directly connected from the $E_s$ terminal to ground, i.e., the voltage network comprising the resistor R3 and R4. The other voltage divider network R1, R2 is connected from the other side of the unknown resistance $R_x$, i.e., the common terminal, to ground. A pair of sampling switches 62, 64 are controlled by the microprocessor 54 so that they alternately and successively connect the junction of the resistors R1, R2 and the junction of the resistors R3, R4 to the input of the buffer 50. These analog voltages are supplied through the buffer 50 to the analog-to-digital converter 52 wherein they are converted to digital numbers and are employed by the microprocessor 54 to determine the desired quantity $(VR4/VR2)-1$ and hence the value of the unknown resistance $R_x$. It will be noted that in the circuit arrangement of FIG. 2 neither of the switches 62, 64 is connected directly across the unknown resistance $R_s$ so that no switch leakage problems are presented and an extremely high value of insulation resistance $R_x$, in the order of 5000–10,000 megohms may be measured. Also, since separate voltage dividers are used in the circuit of FIG. 2, the voltage divider R1, R2 may be chosen to produce a much higher value of unknown voltage V'R2 than the voltage divider R3, R4 which produces the known voltage VR4 across the resistor R4. For example, the unknown voltage developed across resistor R2 may be chosen to be 20 times the value of the known voltage produced across the resistor R4. Such an arrangement has the advantage that a larger unknown voltage is developed across the resistor R2 which can more accurately be translated into a digital number by the analog-to-digital converter. Since the microprocessor is employed to take the ratio of the known voltage across the resistor R4 to the unknown voltage across the resistor R2 and this unknown voltage has been increased by a factor of 20 (in the denominator of the ratio), the microprocessor is then programmed to multiply the resulting ratio by a factor of 20 so that the resistors R2 and R4 are effectively given the same value by the microprocessor 54 but the analog-to-digital converter 52 is able to measure a higher unknown voltage across the resistor R2. Such an arrangement is particularly important where an extremely high value of insulation resistance $R_x$ is being measured in which case the voltage across R2 is quite small due to the large value of the series unknown resistance $R_x$. After the mircoprocessor has multiplied the resulting ratio by 20, it then subtracts unity from the modified ratio to obtain the value $R_x/(R1+R2)$, as discussed heretofore in detail in connection with FIG. 1.

It will be noted that in both the embodiment of FIG. 1 and in the embodiment of FIG. 2 the value (VR2/V'R2)−1 computed by the microprocessor 54 increases in value as the value of the unknown $R_x$ increases. This is because the ratio taken by the microprocessor 54 is the ratio of the known voltage across the resistor R2, i.e., the voltage when the sampling switch S-1 is in the position opposite to that shown in FIG. 1, compared to the ratio of the unknown voltage across the resistor R2 which becomes smaller as the value of the unknown resistance $R_x$ increases. If this quantity is directly converted into a corresponding analog voltage and applied to the meter 60 the needle of the meter would increase by a move to the right with increasing value of the measured resistance. However, conventional resistance meters are arranged so that 0 volts is registered at the right hand edge of the scale and increasing resistance moves the meter needle to the left. In accordance with a further aspect of the invention, the microprocessor 54 is arranged to invert the calculated quantity, preferably by taking the complement of the number calculated therein, and this inverted number is then supplied through the converter 56, and the digital to analog converter 58 to the analog meter 60. Accordingly, even though the voltage ratio measuring arrangement of the present invention provides an increasing signal for increasing unknown resistance, the actual display on the meter 60 will be in accordance with conventional resistance meter techniques wherein 0 is at the right, as shown in FIG. 3.

In accordance with a further aspect of the present invention, the preferred resistance measuring arrangement described in connection with FIG. 2 is incorporated in a multi-range resistance meter which is a portable, battery-operated unit contained within a housing, the front panel of which is indicated at 66 in FIG. 3. In this resistance meter the value of the supply voltage $E_s$ may be manually adjusted by means of the five position selector switch 68 (FIG. 2) so that the insulation resistance being checked may be tested under various different applied voltages. In this connection it will be understood that the characteristics of the insulation being measured, such as a transformer winding or motor winding, may vary with the applied voltage and hence it is desirable to be able to check the insulation resistance being tested at a number of different voltages. In the resistance meter of the present invention the selector switch 68 is actuated by means of the control knob 70 on the front panel 66 and permits the selection of test voltages of 100 volts, 250 volts, 500 volts and 1000 volts. The selector switch 68 has a fifth position in which a continuity check may be made, as will be described in more detail hereinafter. In the specific power supply arrangement of the resistance meter of the present invention an oscillator 72, which is arranged to be turned on and off by the microprocessor 54 by means of a signal over the conductor 74, supplies a variable power output stage 76 which is controlled by the selector switch 68 so as to provide any one of the four test voltages, the AC power developed by the output stage 76 being supplied to a rectifier and filter circuit 78.

In the resistance meter of the present invention the relatively high test voltages supplied by the rectifier and filter circuit 78 are employed only for the upper resistance ranges of the meter and for the 0–50,000 ohm and the 0–500,000 ohm scales a −5 volt regulated power supply 80 is substituted as the supply voltage $E_s$. In accordance with a further aspect of the invention the power supply 80 is automatically connected into the circuit as the supply voltage $E_s$ by means of the diode 82 whenever the oscillator 72 is deenergized and no voltage is developed in the output of the rectifier and filter circuit 78. More particularly, if an output voltage is developed by the circuit 78, such as −100 volts, the diode 82 will be nonconductive and disconnects the supply 80 from the supply terminal $E_s$. However, when the oscillator 72 is turned off in response to a signal on the conductor 74 from the microprocessor 54, the voltage developed by the rectifier and filter circuit 78 falls to 0. However, as soon as this voltage falls to −5 volts, the diode 82 conducts and a −5 volt supply voltage is connected to the resistance measuring circuit from the supply 80.

It will be noted that when different test voltages are selected by the selector switch 68 and supplied to the resistance measuring circuit the value of the voltages supplied through the sampling switches 62, 64 to the analog-to-digital converter 52 will vary over a wide range. For example, considering the known resistance divider, if the value of R4 is adjusted to give a voltage near the upper limit of the 5 volt measuring range of the A/D converter 52 when a 100 volt test voltage is employed, and this test voltage is changed to 1000 volts, the voltage across the resistor R4 would be 10 times larger than the acceptable input range of the A/D converter 52. This means that theoretically a different set of voltage dividers and sampling switches should be employed for each test voltage, i.e., that four different sets of voltage dividers and sampling switches would be required for the illustrated four test voltages selectable by the switch 68. However, in the resistance meter of the present invention the simplified arrangement shown generally in FIG. 4 is employed wherein the two sets of sampling switches 62, 64 and 84, 86 are employed and are connected to different points on the same divider chain. More particularly, for the 500 volt and the 1000 volt range test voltages, the sampling switches 62 and 64 are alternately controlled to supply the voltages from the resistors 88 and 90 to the input of the microprocessor. For the 100 and 250 volt test voltages, the sampling switches 84 and 86 are alternately closed, under the control of the microprocessor 54, instead of the switches 62 and 64.

When the sampling switch 84 is closed the serial voltage across both of the resistors 92 and 88 is supplied to the microprocessor and when the sampling switch 86 is closed the serial voltage across both the resistors 94 and 90 is supplied to the microprocessor. The unknown divider chain is completed by the top resistor 96 and the known resistor chain by the resistor 98, these resistors corresponding to the upper resistors R1 and R3 in FIG. 2. When a test voltage of 500 volts is employed, the voltage divider chains are chosen so that the maximum voltage across the resistors 88 and 90 is somewhat less than one-half the maximum input voltage range of the A/D converter 52. Accordingly, when a 1000 volt supply voltage is employed, the voltages across these same resistors will be somewhat less than the full input range of 5 volts so that the analog-to-digital converter 52 will never become overloaded. In a similar manner, when a supply voltage of 100 volts is employed the resistor combinations 92, 88 and 94, 90 are chosen so that the maximum voltages developed across these resistor combinations is somewhat less than two-fifths of the input range of the A/D converter 52. Accordingly, when a 250 volt supply is used the voltage across these resistor combinations will still be within the acceptable range of the A/D converter 52.

In accordance with a further important aspect of the present invention, a number of different resistance ranges may be automatically selected by the microprocessor 54 and the operator is informed of the particular range which is selected by means of a series of indicator lights on the front panel 66. Furthermore, the microprocessor 54 is programmed so that the lowest resistance scale is initially selected in which full scale output has been designed so that it will not exceed the input capabilities of the A/D converter 52.

If the unknown resistance has a value above ninety percent of full scale of the lowest resistance scale the microprocessor 54 then automatically switches to the next higher resistance scale and if the value of the unknown resistance is more than ninety percent of full scale of that scale the microprocessor again automatically selects the next higher resistance scale. This process of automatically selecting the next higher resistance range is continued by the microprocessor 54 until the resistance range is reached in which the unknown resistance has a value less than ninety percent of full scale of that particular resistance range.

If the value of the unknown resistance decreases to a point where its value is less than six percent of the resistance scale then being used, the microprocessor automatically selects the next lower resistance scale. Thus, if the unknown resistance has a value slightly more than 45,000 ohms (ninety percent of full scale in the 0–50K range) the microprocessor will automatically shift to the next higher range, 0–500K ohms. However, the microprocessor will not automatically shift back to the lower range (0–50K) until the value of the unknown resistance has dropped to less than 30,000 ohms (six percent of full scale of the 0–500K range). By providing an overlap between the points at which the microprocessor automatically shifts up and down hunting between ranges is avoided.

In the illustrated embodiment a series of six resistance ranges are provided. The first resistance range is from 0 to 50,000 ohms and the LED 100 on the front panel 66 is lit by the microprocessor 54 while this lowest resistance range is being utilized. The next resistance range is from 0 to 500,000 ohms and the LED 102 informs the operator when this resistance scale is being used. The next four resistance ranges are in the megohm range and are utilized to test high insulation resistances, such as transformer windings, motor windings, and the like. The lowest megohm resistance range is from 0 to 5 megohms and the LED 104 informs the operator when this range is being selected. The next resistance ranges are from 0 to 50 megohms during which the LED 106 is lit, 0 to 500 megohms during which the LED 108 is lit and 0 to 5000 megohms during which the LED 110 is lit. All of these fixed resistance ranges use the same resistance scale on the meter 60, as shown in FIG. 3. As discussed in detail heretofore, each of these scales is linear throughout its range so that an uncrowded scale reading even to as high an insulation resistance as 5000–10,000 megohms is provided by the arrangement of the present invention.

As discussed generally heretofore, a test voltage of $-5$ volts is employed for the 0–50K and 0–500K low resistance ranges, as in a conventional ohmmeter, and test voltages of $-100$ V. to $-1000$ V. may be utilized in the four megohm range when insulation resistance is being measured. When the unknown resistance has a capacity associated with it this capacity must be charged to the test voltage which is being utilized during the resistance measurement. The microprocessor interprets the changing of this capacity as a variable resistance and when this variable resistance exceeds 450K ohms the microprocessor will automatically switch to the next higher range, i.e. 0–5 megohms. However, when a megohm range is selected the test voltage is also changed to a much higher value ($-100$ to $-1000$ V.) so that the capacity associated with the unknown resistance now looks like a much lower value of resistance having a value below 300,000 ohms and the microprocessor switches back to the 0–500K ohm scale. Since a $-5$ volt test voltage is used on the 0–500K ohm scale the microprocessor would interpret the now almost fully charged capacity as a high resistance and switch back to the 0–5 megohm range again. The result would be that the microprocessor would continue to switch back and forth between the 0–500K range and the 0–5 megohm range when the unknown resistance has a relatively large capacity associated with it. This condition may be avoided by programming the microprocessor to wait for a period of from one to two seconds before it measures the output of the buffer 50 when changing back and forth between the 0–500K ohm scale and the 0–5 megohm scale. In the alternative, the microprocessor 54 may be programmed so that as between the 0–500K ohm scale and the 0–5 megohm scale it will only shift up and not down. However, the microprocessor can still shift up and down between the two ohmmeter ranges 0–50K and 0–500K, since a $-5$ volt test voltage is used for both of these ranges. Also, the microprocessor can shift up and down between the four megohm ranges, since the same test voltage is used for all four of these ranges. Accordingly, if the meter is reading, for example, 650 megohms and a short occurs across the unknown resistance, the microprocessor will shift back down to the 0–5 megohm range and register zero on this range, but will not switch on down to the 0–500K ohm range. Such an arrangement is preferred because no delay is required for the microprocessor to switch up to higher resistance ranges. If the operator wishes to measure the value of the low resistance short he can, of course, depress the push button 112 again in which case the microprocessor will start at the lowest resistance range 0–50K again, or the operator can adjust the knob 70 to the continuity position 122 if a lower resistance range is required.

In order to initiate a resistance measurement, the NORMAL push button 112 is pressed by the operator which causes the microprocessor 54 to initiate the proper range selection without any further action on the part of the operator. Also, in accordance with a further aspect of the invention no power is consumed by any of the electronic circuits of the resistance meter of the present invention until the normal push button 112 is depressed to obtain a reading. Accordingly, no energy is consumed by the resistance meter of the present invention unless an actual resistance measurement is being made.

In many instances, the winding whose insulation resistance is being measured may have an AC voltage on it and the operator may not be aware that such a condition exists. Accordingly if he places the test leads, which are connected to the common terminal 114 and the meg/ohm/volts terminal 116, across an unknown resistance which has an AC voltage of relatively large magnitude on it, a relatively high voltage may be impressed upon the semiconductor analog switches 62, 64 and 84, 86 which would be sufficient to destroy these circuit components. Also a relatively high voltage to the input of the buffer 50, A/D converter 52 and the microprocessor 54 could destroy these elements. In order to prevent such a situation, and in accordance with a further aspect of the present invention, the microprocessor 54 is programmed so that it first makes a test to determine whether or not AC voltage greater than a small minimum voltage of 6–8 volts is present on the resistance element being measured. This test is made before any resistance measurements are made and if AC voltage greater than this minimum is present at the measuring terminals the microprocessor does not proceed to make any resistance measurements. During this AC TEST THE LED 118 is lit to inform the operator that an AC check is being made. Also, this AC voltage is displayed on the scale 120 of the meter 60 so that the operator is informed of the presence of AC voltage on the terminals being measured as a safety precaution. It is possible to use the resistance meter of the present invention as an AC volt meter which will measure the AC input voltage on the 0 to 600 volt scale shown in FIG. 3. Only if less than minimum AC voltage is present on the resistance element being measured will the microprocessor 54 then proceed to go to the resistance range switching program outlined above.

As discussed generally heretofore the control knob 70 may be adjusted by the operator to a continuity position 122 (FIG. 3). The microprocessor 54 is programmed so that it will not make a continuity check until the AC volts test has been made. However, if less than a minimum AC voltage is present on the element being measured the microprocessor is programmed to make a continuity check instead of proceeding to the resistance range switching outlined above when the knob 70 is in position 122. During this continuity test the LED 124 is lit to inform the operator that the test is for continuity. Also, the ohms scale 126 on the meter 60 may be read by the operator, this scale being from 0 to 250 ohms reading from right to left as in a conventional ohmmeter. In this connection it will be noted that all six of the resistance measuring scales of the meter 60 read from right to left for increasing resistance, as in conventional ohmmeters, due to the inversion of the calculated quantity in the microprocessor 54 as discussed heretofore.

Considering generally the manner in which the four megohm resistances ranges are automatically selected by the microprocessor, the lowest range 0 to 5 megohms is selected by the microprocessor by closing the relay SR-4 (FIG. 4) which places the resistor 130 in shunt with the voltage divider chain 96, 92 and 88. The resistor 130 has a value such that the voltage across the resistor 88, or the voltage across the resistors 92 and 88, will be properly calibrated for this resistance scale of 0–5.0 megohms.

If the unknown resistance $R_x$ has a value greater than 4.5 megohms (ninety percent of full scale on 0–5 megohm scale) the microprocessor 54 opens the relay SR-4 and closes the relay SR-3 which places the resistor 132 in shunt with the voltage divider chain 96, 92 and 88. The resistor 132 is chosen so that the voltage across the resistor 88 is properly calibrated for the resistance scale of 0–50 megohms. If the unknown resistance has a value greater than ninety percent of full scale on the 0 to 50 megohm range, the microprocessor 54 responds by opening the relay SR-3 and closing the relay SR-2 which places the resistor 134 in shunt with the divider chain 96, 92 and 88 so that the 0 to 500 megohm scale is calibrated for measurement. If the unknown resistance has a value greater than ninety percent of full scale on the 0–500 megohm range, the relay SR-2 is opened so that the voltage divider chain 96, 92, 88 is employed directly to measure the insulation resistance on the highest scale of 0–5000 megohms. In this connection it will be noted that during these four range switching operations the known divider chain 98, 94 and 90 is not changed and hence the four megohm resistance ranges may be automatically selected in a simple manner by closing the relays SR-2, SR-3 and SR-4 while permitting any one of the four different test voltages to be employed during the resistance measuring operation and while employing only the four sampling switches 62, 64 and 84, 86 to accommodate a range of test voltages of from 100 v. to 1000 v.

In many instances there may be capacity associated with the insulation resistance being measured and this capacity is charged during the resistance measuring operation to the applied test voltage $E_s$. Since this test voltage may be as high as 1000 volts in the resistance meter of the present invention the capacitive element of the winding could remain charged after the resistance measurement is completed and might cause injury to the operator who accidentally touches the capacitive element while it is still charged. In order to eliminate this situation and arrangement is provided which automatically discharges any capacity which may be present across the terminals 114, 116 after the NORMAL read push button 112 is released and battery power is removed from the circuit components. This action is provided by a delay circuit as will be described in more detail hereinafter and the LED 136 on the front panel 66 is lit to inform the operator that the capacitive element across the terminals 114, 116 has been discharged after the resistance test operation. Also, the microprocessor is programmed to sample the battery voltage of the portable resistance meter of the present invention. If the battery voltage drops to a first level at which the battery should be changed but accurate resistance measurements can still be made, the microprocessor lights the LED 138 continuously to inform the operator of this situation. However, if the battery voltage drops below this first level to a second level at which the meter will not function properly, the microprocessor flashes the LED 138 to inform the operator of this fact and does not proceed further with its program so that no resistance measurements can be made until the battery is replaced.

In many instances, insulation resistance measurements of various types of rotating machinery are taken periodically by plant personnel to check that this machinery is operating satisfactorily. Since the temperatures at which these periodic checks are made may vary considerably, it is customary to correct the resistance measurements to 40° C. so that a comparison of different resistance measurements can be made based on the same temperature reference. In this connection it should be noted that insulation resistance customarily has a negative temperature coefficient and if the measurement is made at a higher temperature than 40° C. the actual resistance which is measured may be considerably lower than the value corrected to 40° C. In accordance with an important aspect of the present invention, this resistance correction to 40° C. may be obtained automatically by the operator by setting the slider 140 of a linear potentiometer 141 which is connected in series with the potentiometer 143 to the —5 volt supply. The operator sets the slider 140 to the measured temperature of the winding under test and then depresses the push button 142 instead of the normal push button 112. If, for example, the temperature of the winding under test has been determined to be 60° C., the slider 140 is moved to this point on the scale on the front panel 66, as indicated by dotted lines in FIG. 3, and the push button 142 is depressed. When the button 142 is actuated a resistance measurement is made in the same manner as discussed in detail heretofore when the button 112 is pressed. However, a signal is also supplied over the conductor 144 (FIG. 2) to the microprocessor 54 which responds to this signal by going to a separate subroutine which converts the actual resistance measurement obtained to a corresponding resistance value corrected to 40° C. This corrected resistance value is then displayed on the meter 60 and the appropriate range scale LED is lit by the microprocessor 54 so that the operator may read directly on the meter 60 the corrected resistance value of the winding being measured.

In accordance with a further aspect of the invention, the corrected resistance value is displayed on the meter 60 and the appropriate range scale is indicated even though the actual resistance being measured is on a different resistance range. For example, if the winding being measured has an actual resistance of forty megohms and the winding temperature is 60° C. the relay SR-3 will be closed to select the 0 to 50 megohm range. However, when the resistance correction button 142 is pressed the microprocessor 54 stores a digital value corresponding to the 40 megohms measured and computes with a look-up table the value of this resistance corrected to 40° C. Since the resistance doubles every 10° C. approximately, the resistance value corrected to 40° C. will be 160 megohms. This value of 160 megohms cannot be displayed on the 0 to 50 megohm scale and accordingly the microprocessor will light the LED 108, corresponding to the 0 to 500 megohm scale, while at the same time supplying a value equal to 160 megohms through the serial to 8 bit converter 56 to the digital-to-analog converter 58 so that the meter 60 reads 160 on the 0 to 500 megohm scale corresponding to the LED 108. This corrected resistance value is displayed on the meter 60 even though the relay SR-3 remains closed, corresponding to a resistance range of 0 to 50 megohms which contains the actual resistance value of the winding i.e., 40 megohms.

The voltage developed at the slider 140 is sampled by the microprocessor 54 by closing the semiconductor analog switch 145 which supplies an analog voltage within the 5 volt range of the A/D converter 52 and corresponding to the setting of the slider 140 i.e., the winding temperature of the winding being measured. The microprocessor 54 responds to the initiate resistance correction signal supplied over the conductor 144 when the button 142 is pressed, and the input supplied through the switch 145 corresponding to the actual winding temperature, by modifying the actual resistance value to the corresponding resistance at 40° C.

In addition to the analog switches 62, 64, 84, 86 and 145, and the relays SR-2, SR-3 and SR-4, the microprocessor 54 also controls a number of other relays and semiconductor analog switches, indicated generally at 147 in FIG. 2 to control selection of the 0 to 50,000 and 0 to 500,000 resistance ranges, the AC test circuit, the capacitor discharge circuit, the battery test circuit and the continuity check circuit, as will be described in more detail hereinafter.

Figure 7:
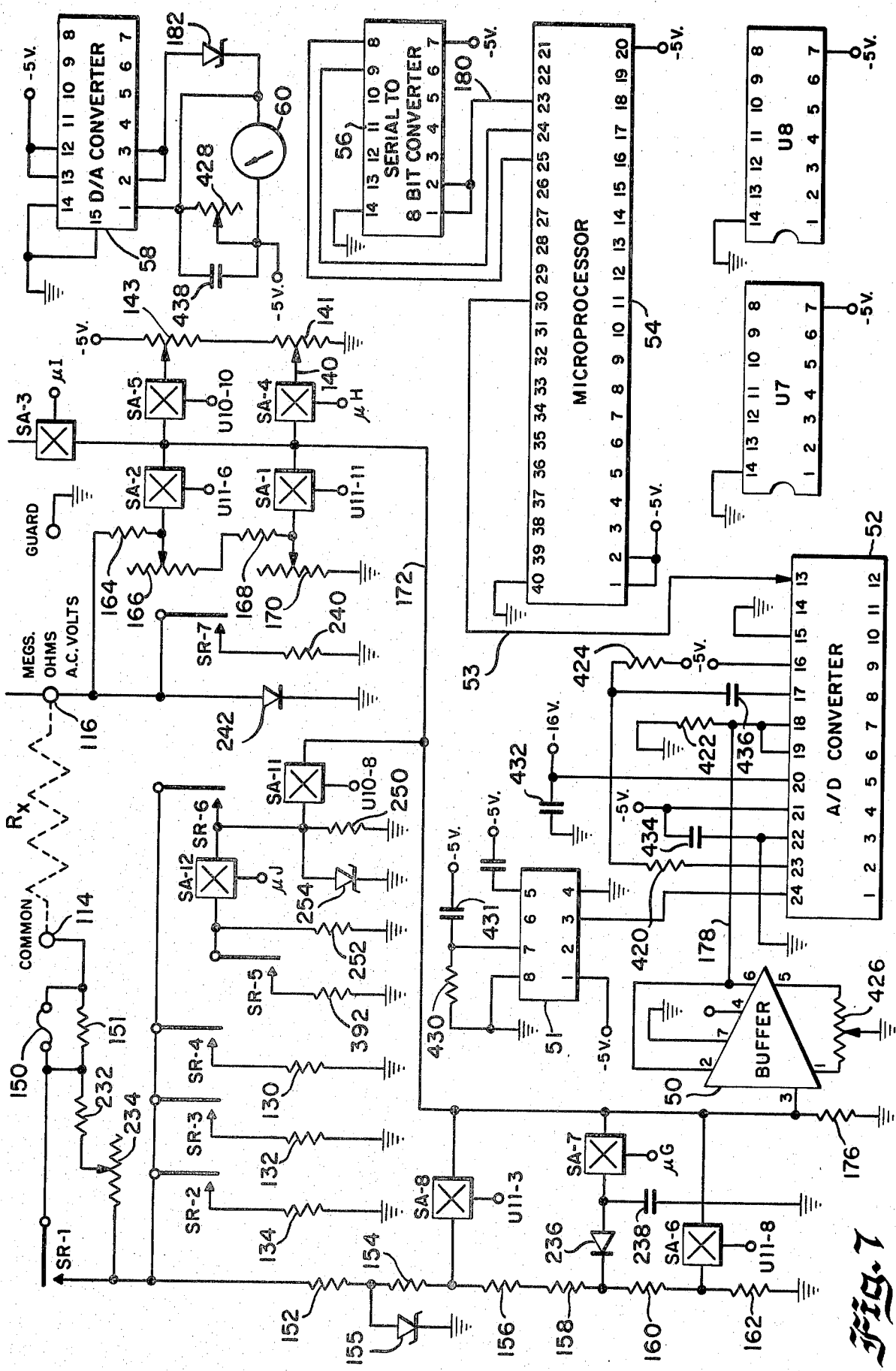

Referring now to the detailed schematic of the resistance meter of the present invention shown in FIGS. 6 to 8, inclusive, the common terminal 114 is connected through the fuse 150 and the relay SR-1 to the unknown voltage divider chain which comprises the resistors 152, 154, 156, 158, 160 and 162. The resistors 152 and 154 collectively correspond to the resistor 96 in FIG. 4, the resistors 156, 158 and 160 collectively correspond to the resistor 92 in FIG. 4 and the resistor 162 corresponds to the resistor 88 in FIG. 4. A Zener diode 155 is connected between the junction of the resistors 152, 154 and ground to provide protection for the analog switches SA-6 and SA-8. A resistor 151 is connected across the fuse 150. Preferably, the resistor 151 has a valve of one megohm so that if the relay SR-1 is closed and the fuse 150 burns out this condition can be detected by shorting the leads connected to the terminals 114, 116. If the meter under these conditions measures 1 megohm (on the 0–5 megohm scale) the operator will know that the fuse has blow.

The known divider chain comprises the resistor 164, the potentiometer 166, the resistor 168, and the potentiometer 170, the arm of the potentiometer 166 being connected to the semiconductor analog switch SA-2 and the arm of the potentiometer 170 being connected to the semiconductor analog switch SA-1.

The analog switches SA-6 and SA-1 correspond to the switches 62, 64 in FIG. 4 and the analog switches SA-8 and SA-2 correspond to the switches 84, 86 in FIG. 4. The outputs of all four of these switches are supplied over the conductor 172 to the input of the high impedance buffer 50 which may be of the commercial type LF351. A high resistance 176, in the order of 1000 megohms, is connected from the conductor 172 to the ground to prevent the build-up of a static voltage on the high impedance input of the buffer 50. In this connection it will be noted that the test voltages which are employed in the resistance meter are all negative and hence the signals developed across the voltage divider chains are negative voltage signals which are impressed upon the input of the buffer 50. The output of the buffer 50 is supplied over the conductor 178 to the A/D converter 52 which is preferably of the commercial type ADC1211 and provides a 12 bit output on terminals 1-12 thereof. This 12 bit output is supplied through a pair of buffers U7 and U8, which may be of the commercial type 74C901, to the 12 bit input of the microprocessor 54, the specific interconnection of these buffers between the 12 bit output of the A/D converter 52 and the 12 bit input of the microprocessor 54 being shown in table 179 in FIG. 9 of the drawings. A clock 51, which may be of the commercial type 555, is arranged to supply clock pulses to the A/D converter 52, the external components including the resistor 430 and capacitor 431 being chosen so that these clock pulses have a frequency of 160 Khz.

The microprocessor 54 is preferably a single chip microprocessor of the commercial type 3870 manufactured by Mostek.

In order to use a single output line 180 for the output data from the microprocessor 54 a serial to 8 bit converter 56, which is preferably of the commercial type 74C164, is connected between the microprocessor 54 and the digital to analog converter 58, the converter 58 being preferably of the commercial type AD 7523. The microprocessor 54 controls the time at which the A/D converter 52 reads the analog input and converts it to a digital signal over the control line 53. The interconnection between the serial to eight bit converter 56 and the D/A converter 58 is shown in Table 181 in FIG. 9 of the drawings. The output of the digital-to-analog converter 58 is supplied to the meter 60, from pin 1 of the converter 58, a Zener diode 182 being employed to protect the converter 58 from voltage spikes.

Considering now the manner in which the various test voltages are developed in the meter of the present invention, it will be recalled from the preceding general description that no power is drawn from the 12 volt battery 111 until the normal push button 112 is depressed. However, when the push button 112 is closed −12 volts is supplied to the voltage regulator 80, which is preferably of the commercial type 7905, so that −5 volts is supplied to all of the indicated points in the schematic of FIGS. 6 to 8, inclusive. When the push button 112 is closed −12 volts is also supplied to a converter 186, preferably of the commercial type ELEXON Model DC512, which supplies a DC output voltage to the filter circuit comprising the series resistor 188 and shunt capacitor 190 so that −16 volts is developed at the terminal 192 and is supplied to all of the indicated points in the schematic.

The oscillator 72 comprises the NAND gates 194, 196 and 198 which are interconnected to form an RC oscillator. When the button 112 is depressed and −5 volts is developed by the regulator 80a −5 volt signal is supplied through the resistor 200 to pin 4 of the NAND gate 194 so that the oscillator 72 is prevented from oscillating. However, if the voltage on the conductor 202, which is controlled in accordance with signals derived from the microprocessor 54 goes high, i.e., to ground potential the oscillator 72 immediately responds by generating oscillations which are supplied through resistor 204 to the base of a transistor 206 preferably of the commercial type 2N3393. In this connection it will be understood that all high signals are at ground potential and all low signals are at −5 volts in the schematic of FIGS. 6 to 8, inclusive. The collector of the transistor 206 is coupled to the base of an output transistor 208 which is also connected to ground through the resistor 210. The emitter of the transistor 208 is selectively connected through different resistors to −5 volts so as to control the level of power developed by the transistor 208. More particularly, when the rotary switch 68 is in the 100 volt position the emitter of the transistor 208 is connected through a diode 212 and a resistor 214 to −5 volts. The resistor 214 is chosen so that the power which is supplied to the output transformer 216 by the transistor 208 and is rectified and filtered in the circuit 78 will provide −100 volts on the terminal 116 of the meter. When the switch 68 is moved to the 250 volt position the diode 218 and resistor 220 are connected between the emitter of the transistor 208 and −5 volts. On the 500 volt position of the switch 68 the diode 222 and resistor 224 are connected from the emitter of the transistor 208 to −5 volts and in the 1000 volt position of the switch 68 the diode 226 is connected between this emitter and −5 volts directly. Accordingly, any one of the four test voltages may be selected by the operator by manually adjusting the switch 68 to the desired position.

As soon as the read button 112 is depressed and −5 volts is supplied to the components of the meter, the microprocessor 54 immediately checks to determine whether the voltage of the battery 111 is sufficient for the meter to function properly. More particularly, when the switch 112 is closed the battery voltage is supplied to the voltage divider comprising the resistors 228 and 230, the voltage at the junction of these resistors being supplied through the semiconductor analog switch SA-3 to the input of the buffer 50. To control closure of the semiconductor analog switch SA-3 the microprocessor 54 supplies an enabling signal to the muI terminal of the switch SA-3. The interconnections between the microprocessor 54 and various points in the circuit of FIGS. 6 to 8, inclusive, is shown in table 183 in FIG. 9. The details of a typical semiconductor analog switch are shown in FIG. 5 and will be described in more detail hereinafter.

The DC signal across the resistor 230, which is proportional to battery voltage, is converted to digital form in the converter 52 and read by the microprocessor 54. If the battery voltage is below a first level the microprocessor continuously energizes the LED 138 (FIG. 3), but permits resistance measurements to be made. If the battery voltage drops below a second level the microprocessor flashes the LED 138 and is programmed so that two resistance measurements can be made until the battery is replaced. However the microprocessor is programmed so that the AC measuring circuit is still able to respond to an AC voltage on the terminals 114, 116 and the operator is informed that AC is present on these terminals and that he should avoid touching them.

After the battery check has been made by the microprocessor 54, the microprocessor is programmed so that it makes a check to determine whether more than a predetermined minimum AC voltage is present on the terminals 114, 116 before any resistance measurement is made. If an AC voltage greater than this minimum is detected the microprocessor does not proceed to the program step which initiates a resistance measurement so that damage to the resistance measuring circuitry is positively prevented. More particularly, the relay SR-1, which is closed for resistance measurements, is opened for the AC test so that the resistor 232 and potentiometer 234 are placed in series with the common terminal 114 to the unknown voltage divider chain. A diode 236 which is connected to the junction of the resistors 158 and 160 in this chain rectifies the negative half cycles of any AC voltage appearing upon the terminal 114, this half wave rectified voltage being filtered in the capacitor 238 so that a negative voltage is developed across this capacitor when an AC signal is present on the terminal 114. Furthermore, the values of the resistors in the unknown voltage divider chain and the resistors 232 and 234 are chosen so that a peak voltage of six volts is present at the junction of the resistors 158, 160 when the negative half cycles of the AC voltage on the terminal 114 have a peak voltage of 700 volts. This permits the meter of the present invention to measure up to 500 volts rms. AC and to give the operator an indication of the magnitude of this voltage in addition to warning him that AC is present on the unknown resistance and that an unknown resistance measurement cannot be made.

After the relay SR-1 is opened the microprocessor closes the semiconductor analog switch SA-7, by applying an enabling signal to the muG terminal thereof, so that the voltage across the capacitor 238 is supplied to the buffer 50 and is converted to a digital voltage in the converter 52. This digital voltage is supplied to the microprocessor 54 and passes through the microprocessor without inversion since the AC voltage scale of the meter 60 reads from left to right. Also, the microprocessor responds to the presence of more than a minimum voltage on the condenser 238 when the switch SA-7 is closed by preventing the program from continuing to the point where resistance measurements are made. The operator, noting that more than a minimum AC voltage is present on the terminals 114, 116 by lighting of the LED 118, and also by deflection of the meter 60, must then take the necessary steps to remove the AC voltage before he can measure the unknown resistance. The diode 242, which is connected from the terminal 116 to ground at all times, shunts the positive half cycles of any AC voltage impressed upon the terminal 116 to provide a return to ground for AC measurement and also protects the analog switches SA-1 and SA-2 from damage due to these positive half cycles of AC voltage.

If the AC test indicates that less than a minimum AC voltage is present on the terminals 114, 116 the microprocessor 54 then proceeds to make a resistance measurement. As described generally heretofore, the microprocessor is arranged so that it first measures the unknown resistance on the lowest resistance range, i.e., 0–50,000 ohms. If the unknown resistance has a value greater than ninety percent of full scale on this resistance range, i.e., greater than 45,000 ohms, the microprocessor then switches to the next highest resistance scale, i.e., 0–500,000 ohms. The microprocessor continues to switch to higher resistance ranges until the ninety percent value is not exceeded. Also, as discussed heretofore, during the measurement on the two lowest resistance ranges, the oscillator 72 is disabled so that no high test voltage is produced by the circuit 78. When this occurs the diode 82 is conductive so that −5 volts is applied to the terminal 116 as a test voltage.

In order to make a measurement on the lowest resistance range, i.e., 0–50,000 ohms, relays SR-1, SR-6 and SR-7 are closed under the control of the microprocessor 54. Also, the semiconductor analog switch SA-12 is closed by the microprocessor 54 by applying an enabling signal to the muJ terminal thereof. When the relay SR-6 is closed the resistor 250 is connected from the common terminal 114 through the relay SR-1 and the relay SR-6 to ground. When the analog switch SA-12 is closed the resistor 252 is connected across the resistor 250, the parallel resistance of the resistances 250 and 252, and the parallel connected divider chain 152–162, constituting the measuring resistor which is in series with the unknown resistance $R_x$. The voltage developed at the arm of the potentiometer 143 is employed as a reference voltage for the two low resistance ranges, the voltage at this junction being supplied to the input of the buffer 50 through the analog switch SA-5. The voltage across the parallel connected resistances 250, 252 is supplied to this input through the analog switch SA-11.

As stated heretofore the relay SR-7 is closed during the two low resistance ranges and places the resistor 240 in series with the diode 82 to the −5 volt regulated supply 80. The resistor 240 is of relatively low value so that it draws a large current through the diode 82 and stabilizes the potential at the terminal 116 with varying values of the unknown resistance $R_x$. However, the voltage drop through the diode 82 reduces the test voltage to about 4.2 volts. The reference voltage sampled by the switch SA-5 at the arm of the potentiometer 143 is chosen to duplicate the potential at the terminal 116, i.e. 4.2 volts, when the relay SR-7 is closed. Accordingly, the circuit operates exactly the same as if the switch SA-5 were sampling the potential at the known terminal 116, as described heretofore in connection with FIG. 2 and FIG. 4. However, by simulating the potential at the terminal 116 and sampling it through the separate switch SA-5 the complicated switching which would be necessary to avoid placing the high test voltages developed by the circuit 78 across the sampling switch is eliminated. In this connection it will be understood that the simulated potential of terminal 116 is conveniently obtained at the arm of the potentiometer 143 but has no connection with the resistance correction measurement obtained from the slider of the potentiometer 141, as will be described in more detail hereinafter.

The microprocessor 54 alternately closes the switches SA-5 and SA-11 so that the voltages corresponding to the terminal 116 and the voltage across the parallel connected resistors 250 and 252 are alternately applied to the analog-to-digital converter 52 and supplied to the microprocessor 54. In both of the low resistance scales the reference resistor, i.e., the resistor 250 for the 0–500,000 ohm scale or the parallel combination of the resistors 250 and 252 for the 0–50,000 ohm scale, are preferably a substantial proportion of the full scale resistance value so that a substantial voltage is sampled by the switch SA-11 even with an unknown resistor $R_x$ of maximum value for that range. For example, the resistor 250 may have a value of 301,000 ohm which is 60% of the full scale resistance on the 0–500,000 ohm scale. Accordingly, a voltage of substantial magnitude is supplied to the analog-to-digital converter 52 so that it can accurately convert this voltage into a corresponding digital number even when the unknown resistance $R_x$ is of maximum value in each of the two low resistance ranges.

In the two low resistance ohm ranges the microprocessor 54 takes the ratio of the known voltage sampled by the switch SA-5 to the unknown voltage samples by the switch SA-11, multiplies the ratio by 150 and then subtracts 150 from the multiplied ratio. This is equivalent to multiplying the previously discussed quantity (VR4/VR2)−1 by a factor of 150. This multiplication and subtraction by a factor of 150 is employed to make the calculation within the microprocessor more accurate in these ranges and to adjust the computed quantity to provide a maximum resistance reading (minimum deflection) on the meter 60 when the unknown resistor has a value corresponding to this maximum value. Thus, on the 0–500,000 ohm scale, for example, if the unknown resistance $R_x$ has a value of 500,000 ohms, this resistor in series with the resistor 250 (the resistor chain 152–162 has a value of 10 megohms and hence little shunting effect on the resistor 250) will result in an unknown resistor voltage drop of 4.2 volts (the voltage at terminal 116)×⅔. The known voltage sampled by the switch SA-5 is 4.2 volts. Therefore, the ratio of known to unknown voltage drops is 8/3 or 2.66. When 1 is subtracted from this ratio we have 1.66 which when multiplied by 150 gives the number 249. When the complement of this number is supplied to the digital-to-analog converter 58 a maximum resistance reading is provided on the meter 60.

As discussed heretofore, the microprocessor first tests the lowest resistance range of 0–50,000 ohms. If the unknown resistance has a value greater than ninety percent of full scale in this range the microprocessor opens the analog switch SA-12 so that the resistor 252 is taken out of the circuit and the resistor 250 with the parallel connected chain 152–162 remain as the reference resistor for the 0–500,000 ohm range. If the unknown resistance has a value greater than ninety percent of 500,000 ohms the microprocessor then switches to the lowest one of the four megohm resistance ranges, i.e., 0–5 megohms. In order to do this the relays SR-6 and SR-7 are opened and the relay SR-4 is closed. At the same time the oscillator 72 is enabled so that the test voltage selected in accordance with the setting of the selector switch 68 is applied to the terminal 116 in place of −5 volts from the supply 80.

Considering now the manner in which the relay SR-1 is closed after an AC test has been made, it will be seen from the chart of microprocessor functions in table 183 that the microprocessor 54 produces an output signal at the terminal muB (pin 18) when any resistance measurement, either megohms or ohms, is to be made. Also, the microprocessor produces a signal on its output terminal muC (pin 17) when the 0–5 megohms scale is to be selected. The muB signal is inverted in the inverter 260 (FIG. 8) the output of which forms one input of a two input OR gate 262. Also, the muC signal is applied to an inverter 264 the output of which forms the other input of the OR gate 262. The output signals from the microprocessor 54 always go low, i.e., from ground to −5 volts. Accordingly, when the MuB signal is produced, indicating that a resistance measurement is to be made, the output of the inverter 260 goes high and is passed through the OR gate 262 to an OR gate 266 the other input of which is the −5 volt supply. Accordingly, if the pushbutton switch 112 is closed and −5 volts is developed by the supply 80 this high signal is supplied through a resistor 268 to the base of a transistor 270 the collector of which is connected to the relay coil 272 of the SR-1 reed relay, the other end of this coil being connected to ground. The emitter of the transistor 270 is connected to a delayed −5 volt supply identified as −5 DV.

This delayed −5 voltage supply persists for a fraction of a second after the switch 112 is opened to permit the SR-1 relay to remain closed for discharge of the measured circuit, as will be described in more detail hereinafter.

Considering now the manner in which the SR-6 relay is closed, the microprocessor 54 produces a muA output signal (pin 19) when the 500,000 ohm scale is to be selected and produces an output signal on the muJ output terminal (pin 31) when the 50,000 ohm scale is to be selected. Since the relay SR-6 is closed for both the 50,000 ohm scale and the 500,000 ohm scale both the muA and the muJ signals are supplied to control energization of the relays SR-6. More particularly, the muA and muJ signals are applied as two inputs to an AND gate 276 (FIG. 8) the output of which forms one input of an AND gate 278 the other input of which is connected to ground. The output of the AND gate 278 is supplied to an AND gate 280 the other input of which is grounded. The AND gate 280 is of the TTL type so that it can drive the relay coil 282 of the SR-6 relay directly. Accordingly, when either the muJ signal or the muA signal is produced the relay coil 282 is energized and the relay SR-6 contacts are closed.

Considering now the manner in which the relay SR-7 is energized, this relay is also closed for both the 50 K and 500 K scales. Accordingly, the output of the AND gate 276 is supplied as one input of the AND gate 284 (FIG. 6) the other input of which is high except when the switch 68 is on the continuity position, as will be described in more detail hereinafter. The output of the AND gate 284 is supplied as one input to an AND gate 286 the other input of which is the output of the AND gate 260 which is high when any resistance measurement is being made. Accordingly, the output of the AND gate 286 is low for both the 50 K and 500 K ranges, this output being supplied as one input to AND gate 288. The other input of the AND gate 288 is connected from the −5 volt supply through the inverter 290 so that this input is always high when the switch 112 is closed and −5 volts is developed. The output of the AND gate 288 is supplied as one input of a NAND gate 292 (FIG. 8) the other input of which is connected to ground. Accordingly, when either of the muA or muJ signals is produced a high output is developed by the NAND gate 292 which is supplied through the resistor 294 to the base of a transistor 296 the collector of which is connected to the relay coil 298 of the SR-7 relay. The emitter of the transistor 296 is connected to the −5 DV voltage so that the relay SR-7 remains closed for a brief interval after the switch 112 is opened to discharge the unknown resistance circuit, as will be described in more detail hereinafter.

If the unknown resistance has a value greater than ninety percent of 500 K, the microprocessor then opens the relays SR-6 and SR-7 and the analog switch SA-12 and at the same time enables the oscillator 72 so that the selected high voltage test voltage is supplied to the terminal 116 for measurements on the four megohm ranges. Also the microprocessor closes the relay SR-4 so that the lowest megohm range, i.e., 0–5 megohms is selected. The relays SR-6 and SR-7 are opened by removing the output signals from the muA and muJ terminals, the switch SA-12 also being opened by removal of the muJ signal.

Considering now the manner in which the SR-4 relay is closed, the muC signal which is supplied to the inverter 264 is connected to one input of an OR gate 300 the other input of which is the −5 volt supply. Accordingly, production of the muC signal by the microprocessor, indicating that the 0–5 M range is to be measured, supplies a high signal to one input of the OR gate 300, this high signal being supplied through the OR gate 300 through the resistor 302 connected to the base of the transistor 304. The collector of the transistor 304 energizes the relay coil 306 of the SR-4 relay, the emitter of the transistor 304 being connected to the −5 DV supply. Accordingly, the SR-4 relay remains closed after the pushbutton 112 is released so that the resistor 130 remains in the circuit to discharge any capacity across the measuring terminals after the resistance measurement has been made, as will be described in more detail hereinafter.

As discussed generally heretofore, the unknown voltage divider R1, R2 (FIG. 4) is chosen to produce a much higher value of unknown voltage across R2 than the known voltage drop across R4. In the actual circuit of FIG. 7, this means that on the megohm ranges the microprocessor computes the ratio of the known voltage sampled by the switch SA-1 (or the switch SA-2 for test voltages of 100 v. or 250 v.) and the unknown voltage across the resistor 162 sampled by the switch SA-6 (or the voltage across the resistors 156, 158, 160 and 162 sampled by the switch SA-8 for test voltages of 100 v. or 250 v.). The microprocessor 54 then multiplies this ratio by a factor of 20 and subtracts 0.5 from this product. The microprocessor subtracts 0.5 instead of 1.0 because the resistor chain 152–162 was first based on a total value of 20 megohms which was later changed to 10 megohms. The D/A converter 58 and meter 60 are calibrated as if this value is indeed 20 megohms and hence 0.5 is subtracted rather than 1.0. In the program given at the end of this specification (step 80) the subtraction of −0.5 is eliminated because the meter 60 cannot be read to this accuracy (the voltage ratio varies from 1 to about 12 and is multiplied by 20). However, if a digital display is employed instead of the meter 60 the subtraction of 0.5 should be made by the microprocessor 54.

If the unknown resistance has a value greater than ninety percent of 5 M the microprocessor opens the relay contacts SR-4 and closes the relay SR-3, as described heretofore in connection with FIG. 4. More particularly, the relay SR-4 is opened by removing the muC signal and the relay coil 308 of the SR-3 relay is energized directly by applying an output signal to the muF terminal (pin 27) of the microprocessor 54.

If the unknown resistance has a value greater than ninety percent of 50 M the microprocessor opens the relay SR-3 and closes the relay SR-2. The relay SR-3 is opened simply by removing the muF signal. The microprocessor produces the muE signal (pin 26) when a 500 M measurement is to be made, this signal being applied as one input to the AND gate 310 (FIG. 8). The other input of the AND gate 310 is the muG signal which is developed by the microprocessor 54 when an AC measurement is to be made. The output of the AND gate 310 is supplied to the relay coil 312 of the SR-2 relay. Accordingly, the relay SR-2 is closed when the 500 M muE signal is produced so that the resistor 134 is placed across the unknown voltage divider chain, as described in detail heretofore in connection with FIG. 4. In addition, the relay SR-2 is closed during the AC measurement so that the resistor 134 is connected across the unknown voltage divider chain and the voltage at the junction of the resistors 158 and 160 is reduced to a relatively low value which when filtered by the rectifier 236 and capacitor 238 provides an AC measurement signal which does not exceed the 5 volt input level of the buffer 50 and A/D converter 52.

If the unknown resistance $R_x$ has the value greater than ninety percent of 500 M the microprocessor responds by opening the relay SR-2 so that only the unknown divider chain comprising the resistors 152–162 is in the unknown measurement path. The microprocessor opens the relay SR-2 by removing the muE signal.

Considering now the manner in which the oscillator 72 is enabled when the lowest megohm resistance range 0–5 M is selected, since neither the muA nor MUJ signals are now being produced both inputs to the AND gate 284 (FIG. 6) are high so that a high output signal is applied to the terminal 10 of the AND gate 286. The inverter muB signal from converter 260 (FIG. 8) is also supplied to the terminal 9 of the gate 286 so that the output of the gate 286 goes high. Both inputs of the gate 288 are now high so that the output of the gate 288 provides a high signal on the conductor 202 which enables the RC oscillator 72 so that the selected one of the voltages corresponding to the setting of the switch 68 is supplied to the terminal 116. In this connection it will be recalled that the diode 82 does not conduct as soon as the voltage at the terminal 116 falls below −5 volts so that the diode 82 effectively switches the −5 volt voltage developed by the supply 80 out of the resistance measuring circuit for the megohm resistance ranges.

Considering now the manner in which the sampling switches connected to the known and unknown resistor chains are alternately closed by the microprocessor 54, the microprocessor continuously changes the potential on its output muD terminal from −5 volts, at which potential the known resistor chain sampling switches are closed to ground, at which potential the unknown resistor chain sampling switches are closed, this potential varying back and forth between high and low values at a rate of from 30 to 40 per second. Considering first the manner in which the low resistance range sampling switches SA-5 and SA-11 are controlled, the potential on the output line muD is supplied directly to one input of an AND gate 320 (FIG. 8) and through an inverter 322 to one input of an AND gate 324. The output of the AND gate 276, which is low when either the 50 K scale muJ signal or the 500 K scale muA signal is present, is supplied through the inverter 326 to the other inputs of the gates 320 and 324. The output of the gate 320 is supplied through the inverter 328 to the enabling terminal of the SA-11 sampling switch and the output of the gate 324 is supplied through the inverter 330 to the sampling switch SA-5. Accordingly, the switches SA-5 and SA-11 are alternately closed at the sampling rate of the signal developed by the microprocessor 54 on the output conductor muD.

The sampling signal on the conductor muD also controls the sampling switches employed on the four megohm resistance ranges. However, it is also necessary to select a particular pair of these switches in accordance with the setting of the selector switch 68. More particularly, if the switch 68 is in either the 100 volt or 250 volt position the switches SA-2 and SA-8 are to be alternately closed whereas if the selector switch 68 is in the 500 volt or 1000 volt position the switches SA-6 and SA-1 are alternately closed instead of the switches SA-2 and SA-8. To accomplish this, when the switch 68 is in either the 100 volt position or the 250 volt position −5 volts is supplied through either the diode 332 or the diode 334 to the input of an inverter 336 (FIG. 6). When the switch 68 is in either the 500 volt or the 1000 volt position −5 volts is supplied through either the diode 338 or the diode 340 to the input of the inverter 342. The output of the inverter 336 is supplied as one input of an AND gate 344 (FIG. 8) the output of the inverter 342 is supplied to one input of an AND gate 346. The output of the AND gate 286, which is high when resistance measurements are made on any one of the four megohm resistance ranges, is supplied as one input of an AND gate 348 the other input of which is connected to ground. The output of the gate 348 is supplied to the other input of the two AND gates 344 and 346. Accordingly, if the 100 volt or 250 volt test voltage has been selected by the switch 68 the output of the AND gate 344 goes high whereas if a 500 volt or 1000 volt test voltage has been selected the output of the gate 346 goes high. The output of the AND gate 344 is supplied to one input of the two NAND gates 350 and 352 and the output of the AND gate 346 is supplied as one input to the two NAND gates 354 and 356. The muD signal is applied directly to the other inputs of the NAND gates 350 and 354 and the inverted muD signal provided at the output of the inverter 322 is supplied as the other input for the two NAND gates 352 and 356.

All of the semiconductor analog switches used in the meter of the present invention are of the same type and one of these switches is shown in detail in FIG. 5 of the drawings. Referring to FIG. 5, the semiconductor analog switch, such as the switch SA-8 is designed to accept a negative going or low signal on the enabling conductor 360, this signal being applied through the resistor 362 to the base of a transistor 364. The transistor 364 is operated from a −16 volt supply so that an adequate control signal is developed and applied to the control conductor 366 of the analog switch proper which may be of the commercial type 4016 or 4066. The −16 volt supply for the transistors 364 in the semiconductor analog switches is derived from the terminal 192, as described heretofore. Since the transistor 364 is of the PNP type this transistor is turned off when the control signal on the terminal 360 is high, i.e., ground potential so that −16 volts is supplied to the control lead 366 of the 4016 analog switch. However, when the input 360 goes low the transistor 364 is rendered conductive so that the potential at the terminal 366 is near ground and the analog switch proper is rendered conductive. When this switch is rendered conductive any voltage present on the input terminal 368 thereof is transmitted to the output terminal 370 thereof without modification. In this connection it will be understood that four of the analog switches, such as the switches SA-1, SA-2, SA-3 and SA-4, may all be a part of one integrated circuit commonly known as a quad analog switch. It will also be noted that if a voltage greater than 16 volts is applied between the terminals 368 and 370 of the analog switch the switch may be rendered conductive. Accordingly, the point on the unknown voltage divider chain at which the 1000 volt measurement is made with the analog switch SA-6 is chosen to be sufficiently low that the voltage at the junction of the resistors 154 and 156, to which the 100-250 volt analog switch SA-8 is connected is not subjected to more than 16 volts so that the switch SA-8 does not break down when a maximum value signal is being measured by the switch SA-6. This means that the switch SA-6 must have a maximum input of somewhat less than 4 volts when the voltage divider chain has the resistance values given hereinafter.

Considering now the operation of the meter of the present invention when the resistance correction switch 142 is closed instead of the normal read switch 112, when the switch 142 is closed battery voltage is supplied through the diode 374 to the voltage regulator 80 and to the converter 186. In addition, battery voltage is supplied through a resistor 376 to a Zener diode 378 which is connected to ground. The voltage developed across the Zener diode 378 is supplied to the microprocessor as a muL input signal (pin 33) which is used to initiate conversion of the actual resistance being measured to a resistance value corrected to 40° C. When battery voltage is supplied to the regulator 80, −5 volts is supplied to all of the components of the resistance meter so that they function in the manner described in detail heretofore to provide a resistance measurement of the unknown resistance $R_x$. In addition, the generation of the muL signal informs the microprocessor that it should take the resistance value which has been measured and go to a look-up table and determine the corresponding resistance value corrected to 40° C. In order to do this the microprocessor must know the actual temperature at which the resistance measurement is being made. Accordingly, the operator determines the temperature of the winding which is being measured, by a surface measuring technique, thermocouple or the like, and manually adjusts the position of the slider 140 of the potentiometer 141 to this temperature. For example, if the actual temperature at which the resistance measurement is being made is 60° C. the slide 140 will be adjusted to the position shown in dotted lines in FIG. 3. The microprocessor then provides a muH output signal which is supplied to the semiconductor analog switch SA-4 to close this switch so that the potential at the slide of the potentiometer 141 is supplied to the input of the buffer 50 and is converted to a corresponding digital number in the A/D converter 52. The microprocessor then utilizes the actual temperature number together with the actual resistance number to determine the corrected resistance value from a look-up table. The corrected resistance value is then supplied from the microprocessor to the digital-to-analog converter 58 to that the corrected resistance value is displayed on the meter 60. At the same time the microprocessor lights the LED corresponding to the resistance range of the corrected resistance value which is displayed rather than the resistance range of the actual resistance value measured.

Each of the output signals from the microprocessor corresponding to one of the resistance ranges is supplied to one side of the corresponding LED on the front panel 66. For example, the muJ output signal is supplied to one side of the LED 100 when the 0-50K range is being used. The muA signal is supplied to the LED 102 when the 0-500K range is being used, and so forth. The other side of the six LED's 100-110 used to indicate resistance ranges are controlled by the output of an AND gate 380. When the rotary switch 68 is in any one of the four test voltage positions the output of the AND gate 380 is high so that any one of the six LED's 100-110 may be selectively energized by the microprocessor to indicate a desired range. However, since the selection of the LED is made by the microprocessor automatically and is independent of the resistance range at which the unknown resistance $R_x$ is being measured, the microprocessor may light a different one of the LED's when the corrected resistance button is depressed than it would if the NORMAL read button 112 were depressed, as described heretofore in detail.

Considering now the operation of the meter when the switch 68 is moved to the continuity position, in this position −5 volts is supplied to one input of the AND gate 380 (FIG. 8), the other input of which is connected to ground. Accordingly, when the switch 68 is moved to the continuity position the output of the AND gate 380 goes low so as to prevent any of the six LED's corresponding to the six resistance ranges from being energized. Also, when the switch 68 is in the continuity position −5 volts is supplied as one input to an OR gate 382 the other input of which is connected to the output of an inverter 384 the input of which is supplied from the muB inverter 260. Accordingly, even though the switch 68 is on the continuity position, when the read button 112 is closed the microprocessor will function in a normal manner to make an AC test, as described in detail heretofore, and will then go to the lowest resistance range, i.e, 0–50K at which time the muB signal is produced. When a muB signal, which is negative, coincides with a −5 volt signal from the continuity terminal of the switch 68, the output of the OR gate 382 goes from high to low. This output is supplied as one input of an AND gate 386 the other input of which is connected to ground. Accordingly, when the output of the OR gate 382 goes low the output of the AND gate 386 also goes low and energizes the LED 124 to inform the operator that a continuity check is being made. Also, this low signal is supplied through a diode 385 to the muA output conductor of the microprocessor 54 which now acts as an input signal to inform the microprocessor that a continuity test is being made and that the microprocessor should disable the automatic range shifting program so that the microprocessor remains in the 0–50K range. In order to do this, each time the microprocessor is on the 0–50K scale, it looks ahead at the muA conductor, which is used as an output signal conductor for the 0–500K range and if it detects a negative signal on the conductor muA, indicating that the switch 68 is in the continuity position it does not shift to the 0–500K range but instead remains in the 0–50K range.

When the switch 68 is moved to the continuity position −5 volts is also supplied to the relay coil 390 of the SR-5 relay so that this relay is closed and places the resistor 392 in parallel with the resistors 252 and 250, it being recalled that in the 0–50K range the relays SR-6 and SR-7 and the analog switch SA-12 are also closed.

The voltage developed across the resistor 392 is sampled by the switch SA-11 alternately with measurements of the simulated reference voltage by closure of the switch SA-5, as in conventional 0–50,000 ohm range measurements. The microprocessor than takes the ratio of these two voltages, multiplies by 150 and subtracts 150 so that a full scale reading on the meter and a linear continuity scale 126 up to a maximum of 250 ohms is provided, as shown in FIG. 3.

As discussed generally heretofore, it is desirable to discharge any capacity which may be present across the measuring terminals 114, 116 after either the switch 112 or the switch 142 is released and battery voltages removed from the −5 volt supply. In order to accomplish this, when either switch is closed, the −5 volts developed by the regulator 80 is supplied through a diode 396 to a large capacitor 398 so that this capacitor is also charged to −5 volts. The voltage across the capacitor which is termed a delayed −5 DV is supplied to the emitters of the transistors 270, 296 and 304 so that these transistors will function for from 2/10 to 4/10 of a second after the switch 112 or 142 is released. In addition, this delayed −5 volts is supplied to the U17 chip on which the OR gates 262, 266 and 300 appear so that these OR gates may function in a normal manner during the discharge interval. Considering the transistor 296, as long as −5 volts is supplied to the emitter of this transistor and its collector is connected to ground through the relay coil 298, the NAND gate 292 may be deenergized and its output become ground potential (when the voltage regulator 80 ceases to develop −5 volts), and yet the transistor 296 will continue to conduct and hold the relay SR-7 closed for a delay period during which the measuring circuit can be discharged. In a similar manner the transistors 270 and 304 function to hold the relays SR-1 and SR-4 closed for the delay period. Accordingly, for from 0.2 seconds to 0.4 seconds after the switch 112 is released the resistor 130 is placed in series with the relays SR-4 and SR-1 to the terminal 114 and the resistor 240 is connected to the terminal 116 through the relay SR-7. Preferably the resistor 130 has a resistance value of 10,000 ohms which very quickly discharges any capacitive element which may be present across the terminals 114, 116 so that the operator will not be injured if he touches these terminals after the resistance measurement has been made. In this connection it will be recalled that as much as 1000 volts may be supplied to the measured element and if it has a substantial capacity which is not discharged after the resistance measurement is made there is a likelihood that the operator may be injured. It should be noted that closure of the relays SR-1, SR-4 and SR-7 takes place automatically as soon as the read button 112 is released and battery voltage is removed from the regulator 80 without any action on the part of the microprocessor 54.

The delayed −5 DV voltage is also supplied to the emitter of a transistor 410 (FIG. 8) the base of which is connected through the resistor 412 to the −5 volt output of the regulator 80. The collector of the transistor 410 is connected to one side of the discharge LED 136 the other side of this LED being connected to ground. During normal operation when the switch 112 is depressed −5 volts is applied to both the base and emitter of the transistor 410 so that this transistor does not conduct. However, when the switch 112 is released and the −5 volts from the regulator 80 disappears the delayed −5 volts will still be applied to the emitter of the transistor 410 and the base of this transistor is now at ground potential so that the transistor conducts and energizes the discharge LED thereby indicating to the operator that the measured circuit has been discharged by means of the above-described discharge circuit including the resistors 130 and 240.

It should be noted that the above-described delay switching circuit, whereby a load, such as the relay coil 298, or the LED 136, may be energized for a predetermined time interval after the operating voltage has been removed and the base of the transistor falls to ground while a delayed −5 volts is derived from the capacitor 398, is of general application and may be used in any situation where it is desired to delay the operation of the circuit element after power has been removed from the circuit.

When a muG signal is developed by the microprocessor to initiate measurement of AC, this muG signal is supplied through a resistor 414 to the base of a transistor 416 the emitter of which is connected to ground. The collector of the transistor 416 is employed to energize the LED 118 in response to the development of the muG signal on the conductor by the microprocessor 54 so that the operator is informed that an AC test is being made. During an AC test the relay SR-1 is open until a muB signal is generated by the microprocessor 54 indicating that a resistance measurement should be made at which time the relay SR-1 is closed.

The manner in which the microprocessor 52 may be programmed to accomplish the function discussed heretofore is shown in the following table of program steps. In this program the term measuring level refers to an integer ML which is established within the microprocessor to keep track of which one of the six resistance ranges the microprocessor is utilizing. The quantity ML has an arbitrary value of 0 for the 0–50K range, a value 1 for the 0–500K range, a value of 2 for the 0–5 mg range, etc. The microprocessor also establishes an integer DL corresponding to the display level, i.e. the resistance range which is being displayed on the meter 60 since the display range may be different than the measuring range when temperature correction is provided, as discussed in detail heretofore.

Step 1. Wait approximately 26 milliseconds for transients to die down.

Step 2. Set A/D converter 52 to read AC voltage and go to RAD (read A/D converter subroutine), step 64.

Step 3. If AC voltage read is less than 8 volts, go to step 6.

Step 4. Display AC voltage using DIS (Display subroutine), step 67.

Step 5. Go to step 2 to read AC voltage again.

Step 6. Set A/D converter 52 to read battery 111 voltage, close SA-3 and go to RAD, step 64.

Step 7. If battery voltage is within 13% of maximum, battery is ok, so go to step 10.

Step 8. If battery voltage is within 26% of maximum, battery is acceptable, so turn on battery light 138 and go to step 10.

Step 9. Battery voltage is less than 26% of maximum, so do nothing but flash battery light 138 on and off and do not proceed.

Step 10. Disconnect battery from A/D converter 52 and see if the temperature correction button 142 has been pushed, if not, go to step 13.

Step 11. Set A/D converter 52 to read temperature setting of potentiometer 141, close SA-4 and go to RAD, step 64.

Step 12. Save temperature for use later.

Step 13. Set measuring level, ML, to 0.

Step 14. If ML not equal to 0, go to step 16.

Step 15. Set lines for measuring on 50K scale and go to step 25.

Step 16. If ML not equal to 1, go to step 18.

Step 17. Set lines for measuring on 500K scale and go to step 25.

Step 18. If ML not equal to 2, go to step 20.

Step 19. Set lines for measuring on 5 Meg scale and go to step 25.

Step 20. If ML not equal to 3, go to step 22.

Step 21. Set lines for measuring on 50 Meg scale and go to step 25.

Step 22. If ML not equal to 4, go to step 24.

Step 23. Set lines for measuring on 500 Meg scale and go to step 25.

Step 24. Set lines for measuring on 5000 Meg scale.

Step 25. Go to subroutine MRD, step 72, to read known and unknown resistances.

Step 26. If ML greater than 1, indicating Meg scale, go to step 29.

Step 27. Go to subroutine CLO, step 77, to calculate the meter reading for the ohms scale.

Step 28. Go to step 30.

Step 29. Go to subroutine CLM, step 80, to calculate the meter reading for the megohm scale.

Step 30. Set the Display level, DL, to ML.

Step 31. See if meter reading is greater than 90% of full scale, if not go to step 36.

Step 32. See if continuity button has been pressed, if not go to step 34.

Step 33. Set CL and ML to 0 to stay on lowest scale and go to step 61 to display reading.

Step 34. See if ML is equal to 5, the highest level. If so, go to step 40.

Step 35. Add 1 to ML and go to step 14 to measure again.

Step 36. See if meter reading is less than 6% of full scale. If it is not less, go to step 40.

Step 37. See if ML is 0, the lowest level. If so, go to step 40.

Step 38. See if ML is 2, the lowest megohm scale. If so, we should not reduce level to ohm scale, so go to step 40.

Step 39. Subtract 1 from ML and go to step 14 to measure again.

Step 40. See if temperature was read in. If not go to step 50 to display resistance reading.

Step 41. Compare temperature with 40° C. If they are the same, go to step 50. If temperature is less than 40°, then go to step 45.

Step 42. Form T equal to the number of degrees that the temperature is above 40. Let N and R be two integers, such that $T = 10N + R$. *Form corrected meter reading by doubling the uncorrected reading N times and multiplying the result by $1 + (R/10)$.*

Step 43. See if reading is greater than full scale. If not, go to step 48 to display reading.

Step 44. Divide reading by 10 and add 1 to DL. Go to step 43.

Step 45. Let T be the temperature to be corrected to. Form integers N and R, such that $T = 40 - 10N + R$ where R is positive and less than 10. Form corrected meter reading by halfing the uncorrected reading N times and multiplying the result by $1 + (R/10)$.

Step 46. See if reading is less than 6% of full scale. If not, go to step 48 to display reading.

Step 47. Multiply reading by 10 and subtract 1 from DL. Go to step 46.

Step 48. Check to see if temperature corrected reading must be moved to megohm scale. This is done by seeing if DL greater than 1. If so, scale is correct, so go to step 50.

Step 49. Increase DL by 1 and divide reading by 10. Go to step 48.

Step 50. See if meter reading is less than 94% of full scale. If so, go to step 53.

Step 51. See if DL is same as display level used when last reading was displayed. If so, go to step 53.

Step 52. Add 1 to DL and divide meter reading by 10.

Step 53. See if reading is to be on ohm scale. (DL<2). If so, since scale light is already on go to step 61.
Step 54. If DL not equal to 2 go to step 56.
Step 55. Turn on 5 meg light 104 and go to step 62.
Step 56. If DL not equal to 3, go to step 58.
Step 57. Turn on 50 meg light 106 and go to step 62.
Step 58. If DL not equal to 4, go to step 60.
Step 59. Turn on 500 meg light 108 and go to step 62.
Step 60. Turn on 5000 meg light 110 and go to step 62.
Step 61. Turn off scale lights.
Step 62. Go to subroutine, DIS, step 67, to display reading.
Step 63. Go to step 14 to read resistances again.

Subroutine RAD

Step 64. Wait 2 milliseconds to make sure circuit connected to converter is settled down then start conversion.
Step 65. Wait 110 microseconds for conversion to be finished and read in result.
Step 66. Go to the step after the one that transferred control to RAD.

Subroutine DIS

Step 67. Set bit count, B, to 8 and clear D/A converter 52.
Step 68. Send next bit to D/A converter 52 along with strobe.
Step 69. Turn off strobe and subtract 1 from B.
Step 70. IF B not equal to zero, go to step 68.
Step 71. Go to the step after the one that transferred control to DIS.

Subroutine MRD

Step 72. Set A/D to read known resistance.
Step 73. Go to subroutine RAD, step 64, to read it.
Step 74. Set A/D to read unknown resistance and wait about 6 milliseconds for circuit to stabilize.
Step 75. Go to subroutine, RAD, step 64, to read it.
Step 76. Go to the step after the one that transferred control to MRD.

Subroutine CLO

Step 77. Calculate 8 bit meter reading, M, using formula $M=(2K/(u/75))-150$. (K—known, u=unknown).
Step 78. If M greater than 255, set M to 255.
Step 79. Go to the step after the one that transferred control to CLO.

Subroutine CLM

Step 80. Calculate 8 bit meter reading, M, using formula $M=8K/(8u/20)$. (K=known, u=unknown).
Step 81. If M greater than 255, set M to 255.
Step 82. Go to the step after the one that transferred control to CLM.

By way of example, and not in any sense as a limitation to the specific values given, the following circuit values have been found to be satisfactory in the resistance meter of the present invention:

| | |
|---|---|
| Resistors 152, 154, 156, 158, 164 | 2 megohms |
| Resistor 160 | 0.5 megohms |
| Resistor 162 | 1.5 megohms |
| Resistors 268, 302 | 22,000 ohms |
| Resistor 134 | 1.1 megohms |
| Resistor 132 | 101,000 ohms |
| Resistor 130 | 10,000 ohms |
| Resistor 392 | 150 ohms |
| Resistor 252 | 32,100 ohms |
| Resistor 250 | 301,000 ohms |
| Resistor 240 | 220 ohms |
| Resistor 168 | 15,000 ohms |
| Potentiometer 166 | 10,000 ohms |
| Potentiometer 170 | 10,000 ohms |
| Resistor 420 | 200,000 ohms |
| Resistor 422 | 470 ohms |
| Resistor 424 | 1000 ohms |
| Potentiometer 426 | 10,000 ohms |
| Potentiometer 428 | 2000 ohms |
| Resistor 376 | 100 ohms |
| Resistors 228 and 230 | 100,000 ohms |
| Resistor 188 | 1 ohm |
| Resistor 214 | 16 ohms |
| Resistor 220 | 6 ohms |
| Resistor 224 | 2.2 ohms |
| Resistor 232 | 20 megohms |
| Potentiometer 234 | 2 megohms |
| Resistor 151 | 1 megohm |
| Potentiometer 143 | 7,500 megohms |
| Potentiometer 141 | 20,000 ohms |
| Resistor 430 | 1000 ohms |
| Capacitor 238 | .001 microfarads |
| Capacitor 274 | 100 microfarads |
| Capacitors 432 and 434 | 15 microfarads |
| Capacitor 436 | 100 picofarads |
| Capacitor 438 | 2000 microfarads |
| Capacitor 190 | 0.1 microfarads |
| Capacitor 398 | 2000 microfarads |
| Capacitor 440 | 4700 microfarads |
| AND gates 380, 280 | Type 7404 TTL |
| OR gates 262, 266, 300 and 382 | Type 74C32 |
| Inverters 290, 336, 342, 264, 326 260, 322, 330 and 328 | Type 74C04 |
| NAND gates 350, 352, 354, 356, 194, 196, 198 and 292 | Type 74C00 |
| AND gates 344, 346, 324, 320 and 348 | Type 74C08 |
| AND gates 284, 286, 288, 278, 280 and 276 | Type 74C08 |

While the present invention has been illustrated and described in connection with the analog meter 60, it will be understood that a digital display arrangement of any suitable type may be employed in place of the analog meter 60 insofar as the above-discussed features of the present invention are concerned. In such event, the digital to analog converter 58 may be eliminated and the digital display connected directly to the output of the serial to 8-bit converter 56 through a suitable driver circuit, as will be readily understood by those skilled in the art.

While there have been illustrated and described several embodiments of the present invention, it will be apparent that various changes and modifications thereof will occur to those skilled in the art. It is intended in the appended claims to cover all such changes and modifications as fall within the true spirit and scope of the present invention.

What is claimed as new and is desired to be secured by Letters Patent of the United States is:

1. The method of measuring the resistance of an unknown resistor which comprises the steps of measuring the voltage VR across a known resistor when said known resistor is connected to a source of voltage, measuring the voltage V'R across said known resistor when said known resistor is connected in series with an unknown resistor to said source of voltage, computing the quantity (VR/V'R)−1, and developing an output signal proportional to said computed quantity which corresponds to the resistance value of said unknown resistor.

2. The method of claim 1, wherein the measurements of VR and V'R are alternately and repetitively made.

3. The method of claim 1, wherein the successive measurements of VR and V'R are made at a rate in the order of 30 cycles per second.

4. The method of claim 1, wherein said output signal varies linearly with the value of said unknown resistance.

5. A high resistance measuring circuit, comprising a pair of terminals across which an unknown resistance may be connected, a source of voltage connected to one of said terminals, a first known resistor R1, means permanently connecting said first known resistor to said one terminal so that a voltage drop VR1 is produced thereacross, a second known resistor R2, means permanently connecting said second known resistor to said other terminal so that a voltage drop VR2 is produced thereacross, means for computing the quantity (VR1/VR2)−1, and means for developing an output signal proportional to said computed quantity which varies linearly with the value of said unknown resistance.

6. The measuring circuit of claim 5, wherein said source of voltage is a d.c. source, analog to digital converter means for converting said voltage drops VR1 and VR2 to corresponding digital signals, and microprocessor means for computing said quantity (VR1/VR2)−1 as a digital output signal.

7. The measuring circuit of claim 6, which includes digital to analog converter means connected to the output of said microprocessor for developing an analog signal corresponding to said digital output signal, and analog display means connected to the output of said digital to analog converter means.

8. The measuring circuit of claim 5, which includes means for varying the voltage developed by said voltage source.

9. The measuring circuit of claim 5, which includes switch means for periodically sampling the voltage produced across said first and second known resistors and supplying the same to said computing means.

10. The measuring circuit of claim 9, wherein said voltage source is a d.c. voltage source and said switch means comprises semiconductor analog switches individually connected to said first and second known resistors.

11. The measuring circuit of claim 10, which includes means for controlling said semiconductor analog switches so that they are alternately rendered conductive at a rate in order of 30 cycles per second.

12. The measuring circuit of claim 10, which includes A/D converter means having an input connected to the output of said semiconductor analog switches, and microprocessor means connected to the output of said A/D converter means for computing said quantity (VR1/VR2)−1.

13. The measuring circuit of claim 12 which includes high impedance buffer means connected between said semiconductor analog switches and the input of said A/D converter means.

14. The measuring circuit of claim 6, which includes means for supplying a signal to said microprocessor which is proportional to the temperature of said unknown resistor, and means responsive to said temperature signal for correcting said computed quantity to a corresponding resistance value at 40° C.

15. The measuring circuit of claim 12, which includes means for developing a signal corresponding to the temperature of said unknown resistor, means for supplying said temperature signal to said A/D converter means, said microprocessor means including means responsive to said temperature signal for correcting said computed quantity to a corresponding resistance value at 40° C.

16. The measuring circuit of claim 15, wherein said temperature signal developing means includes a manually adjustable potentiometer, and temperature semiconductor analog switch means for supplying an analog temperature signal derived from said potentiometer to said A/D converter means.

17. The measuring circuit of claim 16, which includes a temperature correction push button, and means responsive to actuation of said push button for controlling said microprocessor means so that said temperature analog switch means is closed.

18. The measuring circuit of claim 15, which includes display means connected to the output of said microprocessor means, and means for supplying a signal to said display means corresponding to said temperature corrected computed quantity.

19. A high resistance measuring circuit, comprising a pair of terminals across which an unknown resistance may be connected, a source of voltage connected to one of said terminals, a first known resistor, means permanently connecting said first known resistor to said one terminal, a second known resistor, means permanently connecting said second known resistor to said other terminal, and means controlled by the voltages produced across said first and second known resistors for developing an output signal which varies as a function of the value of said unknown resistance.

20. The measuring circuit of claim 19, which includes range changing means for automatically shunting said second known resistor with another resistor when the resistance value of said unknown resistance exceeds a predetermined value.

21. The measuring circuit of claim 19, which includes a plurality of range changing resistors corresponding to different resistance ranges, and automatic range changing means controlled by the magnitude of said output signal for automatically and selectively connecting different ones of said range changing resistors to said other terminal and thereby shunt said second known resistor.

22. The measuring circuit of claim 21, which includes display means controlled by said output signal and arranged to provide a maximum resistance indication when said output signal has a predetermined value, and means for controlling said automatic range changing means to selectively contact the range changing resistor corresponding to the next higher resistance range to said other terminal when the value of said unknown resistance exceeds approximately 90% of maximum resistance on a given resistance range.

23. The measuring circuit of claim 22, which includes means for controlling said automatic range changing means to selectively connect the range changing resistor corresponding to the next lower resistance range to said other terminal when the value of said unknown resistance falls below approximately 6% of maximum resistance on a given resistance range.

24. A high resistance measuring circuit, comprising a pair of terminals across which an unknown resistance may be connected, means for selectively supplying voltages of different magnitudes to one of said terminals, a first series of resistors connected to said one terminal, a second series of resistors connected to said other terminal, a first pair of semiconductor analog switches connected to different resistors in said first series, a second pair of semiconductor analog switches connected to different resistors in said second series, A/D converter means having an input connected to the outputs of said first and second pairs of analog switches, means connected to the output of said A/D converter means for developing an output signal which varies linearly with the value of said unknown resistance, and means controlled at least in part by said selective voltage supply means for selectively controlling said first and second pairs of analog switches.

25. The measuring circuit of claim 24, wherein said A/D converter means is arranged to accept input signals up to a predetermined maximum value, and said first and second pairs of analog switches are selectively controlled so that said maximum value is not exceeded when voltages of different magnitudes are selectively supplied to said one terminal by said voltage supply means.

26. The measuring circuit of claim 25, wherein said voltage supply means includes a manually operable voltage selector switch, means for developing different control signals corresponding to different positions of said selector switch, and means controlled by said control signals for alternately closing different sets of said analog switches, each of said sets including one analog switch from each of said first and second pairs.

27. A resistance measuring circuit, comprising a pair of input terminals across which an unknown resistance may be connected, resistance measuring means connected to said input terminals and arranged to provide an output signal corresponding to the value of said unknown resistance, means connected to one of said input terminals for detecting the presence of an AC voltage between said one terminal and a reference potential, and microprocessor means programmed to first enable said AC voltage detecting means and then to enable said resistance measuring means only in the event that said AC voltage detecting means does not detect the presence of an AC voltage of predetermined magnitude between said one terminal and said reference potential.

28. The measuring circuit of claim 27, which includes a read push button, means responsive to actuation of said read push button for energizing said microprocessor means.

29. The measuring circuit of claim 27, wherein said resistance measuring means includes a source of voltage connected to the other of said terminals, first and second resistors individually connected to said pair of input terminals, and means controlled by the voltages produced across said first and second resistors for developing an output signal which varies linearly with the value of said unknown resistance.

30. The measuring circuit of claim 29, wherein said AC voltage detecting means includes means connected to one of said first and second resistors for rectifying an AC voltage appearing on said resistor, said microprocessor means being responsive to the output of said rectifying means for preventing said resistance measuring means from operating in the event an AC voltage of said predetermined magnitude is present on said one terminal.

31. The measuring circuit of claim 27, wherein said resistance measuring means includes display means normally providing an indication of the value of said unknown resistance, and means controlled at least in part by said AC voltage detecting means for controlling said display means to indicate the magnitude of the AC voltage detected by said AC voltage detecting means.

32. A portable resistance measuring unit, comprising a housing having a front panel which includes a pair of input terminals to which an unknown resistance may be connected, a battery contained within said housing, a read switch on said panel, an oscillator contained within said housing, means for rectifying the output of said oscillator and supplying a unidirectional voltage to one of said terminals, resistance measuring means connected to said input terminals and arranged to provide an output signal which varies linearly with changes in said unknown resistance, and means operative only during periods when said read switch is actuated for supplying power from said battery to said oscillator and said resistance measuring means.

33. The portable resistance measuring unit of claim 32, which includes a voltage selector switch on said panel, and means controlled by said selector switch for varying the power supplied from said oscillator to said rectifying means, thereby to vary the magnitude of the unidirectional voltage supplied to said one terminal.

34. The portable resistance measuring unit of claim 32, which includes a display device on said front panel for providing an indication corresponding to said output signal, a potentiometer on said front panel which may be manually adjusted in accordance with the temperature of said unknown resistance, means for developing a temperature correction signal corresponding to the setting of said potentiometer, and means for controlling said resistance measuring means in accordance with said temperature correction signal so that an output signal corresponding to the resistance of said unknown resistance corrected to 40° C. is displayed on said display device.

35. A resistance measuring circuit, comprising a pair of input terminals across which an unknown resistance may be connected, resistance measuring means connected to said input terminals and arranged to provide an output signal corresponding to the value of said unknown resistance, a read push button, means operative when said push button is depressed for enabling said resistance measuring means, and means operative as said push button is released for connecting a resistor of low resistance value across said input terminals to discharge any capacity associated with the unknown resistance connected to said input terminals.

36. The resistance measuring circuit of claim 35, which includes means operative when said push button is depressed for supplying a test voltage to one of said input terminals, said test voltage acting to charge any capacity associated with the unknown resistance connected to said input terminals, and means for removing said test voltage from said one terminal when said push button is released so that said low value resistor can discharge said capacity.

37. The resistance measuring circuit of claim 35, which includes a relay having an operating coil, said relay connecting said low value resistor across said input terminals when said operate coil is energized, a transistor having a collector connected to said operate coil, means controlled by said resistance measuring means for supplying a control signal to the base of said transistor to energize said operate coil, and means for supplying an energizing voltage to the emitter of said transistor which persists after said push button is released, whereby said transistor remains conductive to energize said operate coil after said push button is released and said resistance measuring means is disabled.

38. The measuring circuit of claim 21, which includes a read push button, means for connecting said voltage source to said one terminal only during periods when said read push button is depressed, and means for connecting one of said range changing resistors across said pair of input terminals after said read push button has been released, thereby to discharge any capacity associated with said unknown resistance connected to said pair of input terminals.

39. The high resistance measuring circuit of claim 21, wherein a relatively low test voltage is connected to said one terminal for at least one low resistance range and a relatively high test voltage is connected to said one terminal for at least one high resistance range, and means controlling said automatic range changing means so that resistance measurement can only be shifted upwardly from said one low resistance range to said one high resistance range, thereby to avoid switching back and forth between said low resistance range and said one high resistance when a capacity of substantial value is associated with said unknown resistance.

* * * * *